US012567467B2

(12) United States Patent (10) Patent No.: US 12,567,467 B2
Shin (45) Date of Patent: Mar. 3, 2026

(54) MEMORY DEVICE AND OPERATING METHOD THEREOF

(71) Applicant: SAMSUNG ELECTRONICS CO., LTD., Suwon-si (KR)

(72) Inventor: Woosul Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

(21) Appl. No.: 18/732,004

(22) Filed: Jun. 3, 2024

(65) Prior Publication Data

US 2025/0006264 A1 Jan. 2, 2025

(30) Foreign Application Priority Data

Jun. 27, 2023 (KR) ........................ 10-2023-0082882

(51) Int. Cl.
| | |
|---|---|
| *G11C 11/34* | (2006.01) |
| *G11C 16/04* | (2006.01) |
| *G11C 16/08* | (2006.01) |
| *G11C 16/26* | (2006.01) |

(52) U.S. Cl.
CPC .......... *G11C 16/08* (2013.01); *G11C 16/0483* (2013.01); *G11C 16/26* (2013.01)

(58) Field of Classification Search
CPC ...... G11C 16/08; G11C 16/0483; G11C 16/26
See application file for complete search history.

(56) References Cited

U.S. PATENT DOCUMENTS

| | | | | | |
|---|---|---|---|---|---|
| 6,031,760 | A * | 2/2000 | Sakui | ................. | G11C 16/3454 |
| | | | | | 365/185.21 |
| 6,075,734 | A * | 6/2000 | Jang | .................... | G11C 11/5621 |
| | | | | | 365/168 |
| 6,925,005 | B2 * | 8/2005 | Kawamura | ........ | G11C 16/0483 |
| | | | | | 365/185.23 |
| 7,187,584 | B2 | 3/2007 | Chang | | |
| 7,279,174 | B2 * | 10/2007 | Pacetti | .................... | C08L 75/04 |
| | | | | | 424/422 |
| 7,301,825 | B2 * | 11/2007 | Seong | .................. | G11C 16/105 |
| | | | | | 365/189.011 |
| 7,512,020 | B2 * | 3/2009 | Lee | .................... | G11C 16/3454 |
| | | | | | 365/189.05 |
| 8,023,335 | B2 * | 9/2011 | Kang | .................. | G11C 11/5642 |
| | | | | | 365/185.24 |

(Continued)

FOREIGN PATENT DOCUMENTS

KR 10-2023-0068274 A 5/2023

*Primary Examiner* — Viet Q Nguyen
(74) *Attorney, Agent, or Firm* — Sughrue Mion, PLLC

(57) ABSTRACT

A memory device includes a memory cell array, a page buffer circuit including first to Nth page buffers, each page buffer including a sensing node, and a control logic configured to control page buffer operations, wherein the control logic is further configured to control the page buffer operations such that, in a first page buffer operation on a first page buffer included in a first group, a precharge period and a discharge period for a first sensing node of the first page buffer are performed, in a fifth page buffer operation on a fifth page buffer included in a second group, a precharge period and a discharge period for a fifth sensing node of the fifth page buffer are performed, and in a sensing period of the fifth page buffer operation, sensing operations on the first and fifth sensing nodes are performed together.

20 Claims, 20 Drawing Sheets

(56) References Cited

U.S. PATENT DOCUMENTS

| | | | | |
|---|---|---|---|---|
| 8,625,376 | B2 | 1/2014 | Jung et al. | |
| 8,634,251 | B2 * | 1/2014 | Chung | G11C 16/24 |
| | | | | 365/185.25 |
| 9,418,747 | B2 * | 8/2016 | Kang | G11C 16/0483 |
| 10,204,686 | B2 * | 2/2019 | Lee | G11C 16/32 |
| 10,607,688 | B2 * | 3/2020 | Shin | G11C 11/4094 |
| 11,049,579 | B2 * | 6/2021 | Hsu | G11C 11/5642 |
| 11,127,453 | B1 | 9/2021 | Choi | |
| 11,456,041 | B2 * | 9/2022 | Kim | G11C 16/3459 |
| 11,488,644 | B2 * | 11/2022 | Okabe | G11C 16/32 |
| 11,568,903 | B2 | 1/2023 | Cho et al. | |
| 11,742,035 | B2 * | 8/2023 | Choi | G11C 16/26 |
| | | | | 365/185.22 |
| 11,948,645 | B2 * | 4/2024 | Mun | G11C 16/24 |
| 11,972,811 | B2 * | 4/2024 | Hsu | G11C 16/0483 |
| 12,190,964 | B2 * | 1/2025 | Hong | G11C 16/0483 |
| 12,217,808 | B2 * | 2/2025 | Hsu | G11C 16/24 |
| 2021/0280254 | A1 | 9/2021 | Ko et al. | |
| 2021/0287749 | A1 | 9/2021 | Ko et al. | |
| 2022/0366964 | A1 | 11/2022 | Kang et al. | |

* cited by examiner

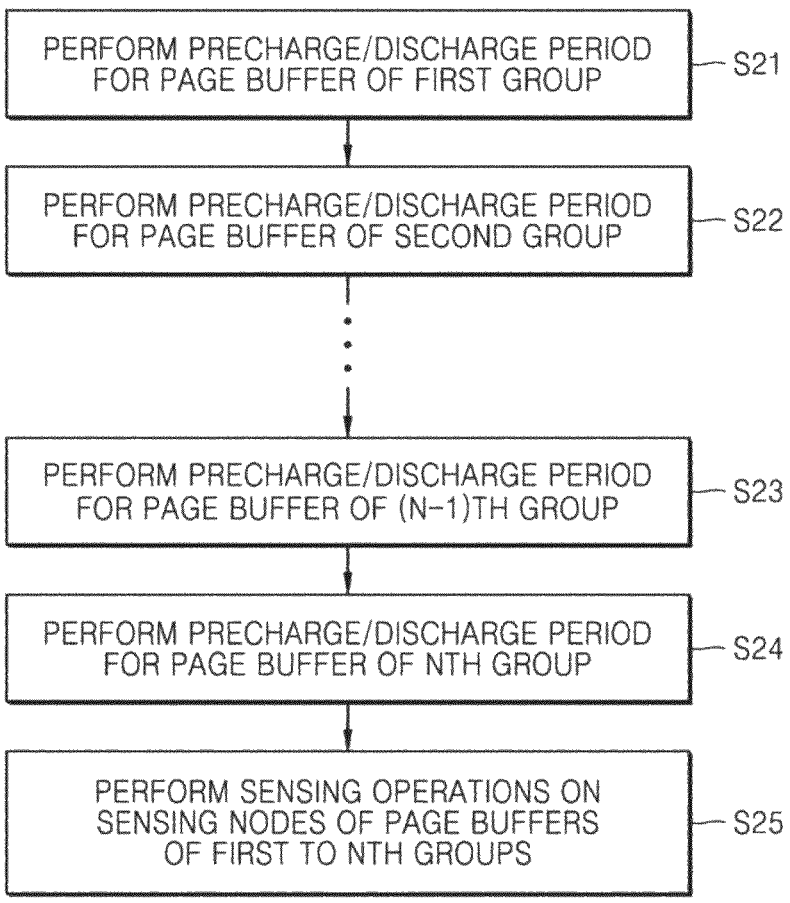

PERFORM PRECHARGE/DISCHARGE PERIOD
FOR PAGE BUFFER OF FIRST GROUP — S21

PERFORM PRECHARGE/DISCHARGE PERIOD
FOR PAGE BUFFER OF SECOND GROUP — S22

PERFORM PRECHARGE/DISCHARGE PERIOD
FOR PAGE BUFFER OF (N−1)TH GROUP — S23

PERFORM PRECHARGE/DISCHARGE PERIOD
FOR PAGE BUFFER OF NTH GROUP — S24

PERFORM SENSING OPERATIONS ON
SENSING NODES OF PAGE BUFFERS
OF FIRST TO NTH GROUPS — S25

MEMORY DEVICE AND OPERATING METHOD THEREOF

CROSS-REFERENCE TO RELATED APPLICATION

This application is based on and claims priority under 35 U.S.C. § 119 to Korean Patent Application No. 10-2023-0082882, filed on Jun. 27, 2023, in the Korean Intellectual Property Office, the disclosure of which is incorporated by reference herein in its entirety.

BACKGROUND

Apparatuses and methods consistent with example embodiments relate to a memory device, and more particularly, to a memory device having improved data processing performance and an operating method of the memory device.

In light of the increasing demand for multi-functionalization of information and communication devices, large capacity and high integration of memory devices are required. Memory devices may include page buffers for storing data in or retrieving data from memory cells, and the page buffers may include semiconductor elements such as transistors. Due to the demand for a reduction in size of a page buffer, according to an increase in degree of integration of the memory device, and the development of process technology, the size of a semiconductor element included in the page buffer may be reduced. Accordingly, a layout of wirings connected to semiconductor elements may become complex.

As a way to increase the degree of integration of the memory device, a structure in which a plurality of input/output units share a combined sensing node has been proposed. However, as the plurality of input/output units share the combined sensing node, a data transfer time within a page buffer or between a page buffer and an external input/output line may be increased, and the increase in data transfer time may deteriorate the data processing performance of the memory device in operations such as programming and reading.

SUMMARY

One or more example embodiments provide a memory device having improved data processing performance based control of a page buffer and an operating method of the memory device.

According to an aspect of the present disclosure, a memory device may include: a memory cell array including a plurality of memory cells; a page buffer circuit including first to Nth page buffers connected to the plurality of memory cells through bit lines and classified into a first group and a second group, wherein N is an integer greater than equal to 2; and a control logic configured to control first to Nth page buffer operations on the first to Nth page buffers, in relation to a program or read operation of data. The control logic may be further configured to: in a page buffer operation of a page buffer belonging to the first group, perform a precharge period and a discharge period for a sensing node in the first group and omit a sensing operation; and in a page buffer operation of a page buffer belonging to the second group, perform a precharge period and a discharge period for a sensing node in the second group and perform a sensing period for the sensing nodes belonging to the first and the second groups are sensed together.

Among the first to Nth page buffers, first to Ath page buffers are classified into the first group, and (A+1)th to Nth page buffers are classified into the second group, wherein A is an integer less than N. The control logic may be further configured to control the first to Nth page buffer operations such that, in the first page buffer operation, a precharge period and a discharge period for a first sensing node of the first page buffer are performed, in the (A+1)th page buffer operation, a precharge period and a discharge period for an (A+1)th sensing node of the (A+1)th page buffer are performed. In the first page buffer operation, a sensing operation on the first sensing node may be omitted, and in a sensing period of the (A+1)th page buffer operation, sensing operations on the first and (A+1)th sensing nodes may be performed together.

In a sensing period of the (A+1)th page buffer operation, data according to a voltage level of the first sensing node is stored in a sensing latch of the first page buffer. Data according to a voltage level of the (A+1)th sensing node may be stored in a sensing latch of the (A+1)th page buffer.

Among the first to Nth page buffers, first to Ath page buffers are classified into the first group, and (A+1)th to Nth page buffers are classified into the second group, wherein A is an integer less than N. A discharge period of the (A+1)th page buffer operation may be set to be shorter than a discharge period of the first page buffer operation.

Each of the first to Nth page buffers may include a page buffer unit, a cache unit, and at least one pass transistor, the page buffer unit including one or more main latches, the cache unit including a cache latch connected to the page buffer unit through a combined sensing node, and the at least one pass transistor configured to control electrical connection with a sensing node of an adjacent page buffer. The page buffer units of the first to Nth page buffers may be arranged in a first direction, and the cache units of the first to Nth page buffers may be arranged in the first direction in a region separated from the page buffer units.

The first group may include first to fourth page buffers, and the second group may include fifth to eighth page buffers. The pass transistors of the page buffers of the first group may be controlled by a first pass control signal, and the pass transistors of the page buffers of the second group may be controlled by a second pass control signal. In the precharge period and the discharge period of the first page buffer operation, the first and second pass control signals may be set to an enable level to establish electric connections between all of the sensing nodes of the first to Nth page buffers. In the precharge period and the discharge period of the fifth page buffer operation, the second pass control signal may be selectively to an enable level, to establish electrical connections only between the sensing nodes of the page buffers included in the second group. In the precharge period and the discharge period of the fifth page buffer operation, a precharge operation and a discharge operation may be selectively performed on the sensing nodes of the page buffers included in the second group.

In a sensing period of the fifth to eighth page buffer operations, the first and second pass control signals may be set to a disable level to establish electrical isolation among the sensing nodes in the first to eighth page buffers.

After the fifth page buffer operation is completed, second and sixth page buffer operations on the second and sixth page buffers, third and seventh page buffer operations on the third and seventh page buffers, and fourth and eighth page buffer operations on the fourth and eighth page buffers may be sequentially performed, and in the second to fourth page buffer operations, the sensing period may be omitted.

In sensing periods of the sixth to eighth page buffer operations, sensing operations on a sensing node of a page buffer belonging to the first group and a sensing node of a page buffer belonging to the second group may be performed together.

According to another aspect of the present disclosure, there is provided an operating method of a memory device, wherein the memory device may include first to fourth page buffers belonging to a first group and fifth to eighth page buffers belonging to a second group, each of the first to eighth page buffers includes a page buffer unit including a sensing node and a cache unit including a cache latch, the page buffer units of the first to eighth page buffers may be arranged in a first direction, and the cache units of the first to eighth page buffers may be connected to the page buffer units through a combined sensing node and may be arranged in the first direction in a region separated from the page buffer units. The operating method may include: in a precharge period of a first page buffer operation on the first page buffer of the first group, electrically connecting the sensing nodes of the first to eighth page buffers; in a discharge period of the first page buffer operation, discharging a first sensing node of the first page buffer according to data stored in the cache latch of the first page buffer; omitting a sensing operation on the first sensing node, and floating the first sensing node by isolating electrical connections between the sensing nodes in the first to eighth page buffers; in a precharge period of a fifth page buffer operation on the fifth page buffer of the second group, electrically connecting the sensing nodes of the fifth to eighth page buffers; in a discharge period of the fifth page buffer operation, discharging a fifth sensing node of the fifth page buffer according to data stored in the cache latch of the fifth page buffer; and in a sensing period of the fifth page buffer operation, performing sensing operations for sensing voltage levels of the first sensing node and the fifth sensing node together.

The operating method may further include: sequentially performing second and sixth page buffer operations on the second and sixth page buffers; sequentially performing third and seventh page buffer operations on the third and seventh page buffers; sequentially performing fourth and eighth page buffer operations on the fourth and eighth page buffers; in the second to fourth page buffer operations, omitting a sensing period; and in a sensing period of the sixth to eighth page buffer operations, performing sensing operations on sensing nodes of two page buffers together.

Each of the first to eighth page buffers may include at least one pass transistor configured to control electrical connection with a sensing node of an adjacent page buffer, the pass transistors of the first to fourth page buffers may be controlled by a first pass control signal, and the pass transistors of the fifth to eighth page buffers may be controlled by a second pass control signal, and in the precharge period and the discharge period of the first page buffer operation, the first and second pass control signals may be set to an enable level to establish electrical connections between all of the sensing nodes of the first to eighth page buffers.

In the precharge period and the discharge period of the fifth page buffer operation, the second pass control signal may be selectively set to an enable level to establish electrical connections only between the sensing nodes of the fifth to eighth page buffers.

The discharge period of the fifth page buffer operation may be set to be shorter than the discharge period of the first page buffer operation.

The cache latch of the first page buffer may be connected to the page buffer units through a first combined sensing node and a second combined sensing node, and the cache latch of the fifth page buffer may be connected to the page buffer units through the second combined sensing node. The operating method may further include: precharging the first combined sensing node while the first and second combined sensing nodes are electrically connected; and discharging the first combined sensing node according to data stored in a sensing latch of the first page buffer.

The operating method may further include: precharging the second combined sensing node while the first combined sensing node is electrically disconnected from the second combined sensing node; discharging the second combined sensing node according to data stored in a sensing latch of the fifth page buffer; and storing data in the cache latches of the first and fifth page buffers by performing sensing operations on the first and second combined sensing nodes together.

According to another aspect of the present disclosure, a memory device may include: a memory cell array including a plurality of memory cells; a page buffer circuit including first to Nth page buffers connected to the plurality of memory cells through bit lines; and a control logic configured to control first to Nth page buffer operations on the first to Nth page buffers, in relation to a program or read operation of data, wherein the first to Nth page buffers may be classified into first to Kth groups, and K is an integer less than N, and the control logic may be further configured to: in a page buffer operation of a page buffer belonging to the first to (K−1)th groups, perform a precharge period and a discharge period for a sensing node and omit a sensing operation; and in a page buffer operation of a page buffer belonging to the Kth group, perform a precharge period and a discharge period for a sensing node and perform a sensing period such that the sensing nodes of the page buffers belonging to the first to Kth groups are sensed together.

The first to Nth page buffers may be classified into first to fourth groups, in a page buffer operation of a page buffer belonging to the first to third groups, a sensing operation is omitted, and in a sensing operation of a page buffer operation of a page buffer belonging to the fourth group, the sensing nodes of the first to fourth groups are sensed together.

In a precharge period of the first to (K−1)th groups, sensing nodes of page buffers belonging to a group in which precharge is performed are electrically connected to sensing nodes of page buffers belonging to the Kth group, and in a precharge period of the Kth group, electrical connection between the sensing nodes of the page buffers belonging to the Kth group and sensing nodes of page buffers belonging to the first to (K−1)th groups is cut off.

BRIEF DESCRIPTION OF THE DRAWINGS

The above and/or other aspects will be more apparent by describing certain example embodiments, with reference to the accompanying drawings, in which:

FIG. 7 is a circuit diagram illustrating in detail a page buffer according to an embodiment;

FIGS. 12 and 13 are flowcharts illustrating an operating method of a memory device according to embodiments;

DETAILED DESCRIPTION OF THE EMBODIMENTS

Hereinafter, embodiments of the inventive concept will be described in detail with reference to the accompanying drawings.

Figure 1:
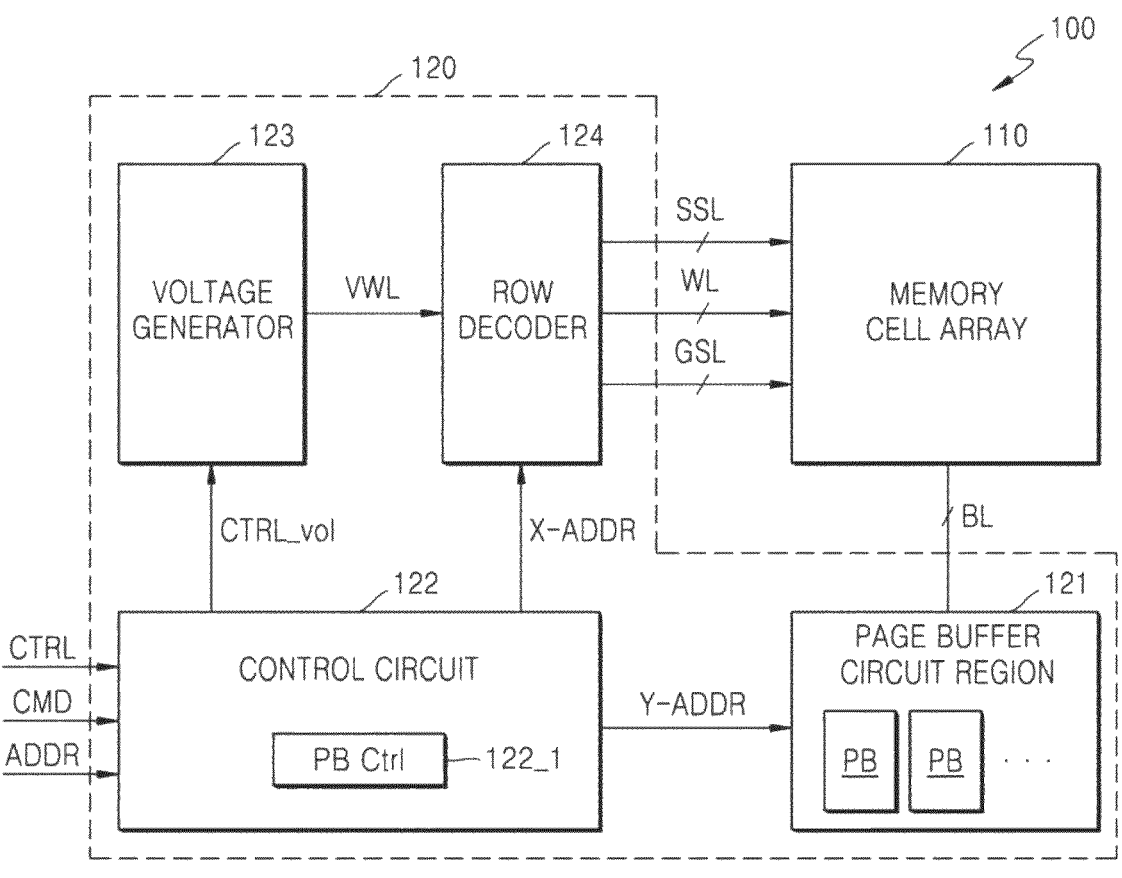
FIG. 1 is a block diagram illustrating a memory device according to an embodiment.

FIG. 1 is a block diagram illustrating a memory device 100 according to an embodiment.

Referring to FIG. 1, the memory device 100 may include a memory cell array 110 and a peripheral circuit 120, and the peripheral circuit 120 may include a page buffer circuit region 121, a control circuit 122, a voltage generator 123, and a row decoder 124.

The memory cell array 110 may be connected to the page buffer circuit region 121 through bit lines BL and may be connected to the row decoder 124 through word lines WL, string selection lines SSL, and ground selection lines GSL. The memory cell array 110 may include a plurality of memory cells, and, for example, the memory cells may be flash memory cells. Hereinafter, embodiments will be described in detail with reference to a case in which the memory cells are NAND flash memory cells, as an example. However, the inventive concept is not limited thereto. In some embodiments, the memory cells may be resistive memory cells, such as resistive random access memory (RAM) (ReRAM) memory cells, phase change RAM (PRAM) memory cells, or magnetic RAM (MRAM) memory cells.

In an embodiment, the memory cell array 110 may include a three-dimensional memory cell array, the three-dimensional memory cell array may include a plurality of NAND strings, and each NAND string may include memory cells respectively connected to word lines that are vertically stacked on a substrate. Detailed descriptions in this regard are provided below with reference to FIGS. 3 and 4, wherein the three-dimensional memory includes multiple levels, and word lines and/or bit lines are shared between the levels.

The control circuit 122 may output various control signals, for example, a voltage control signal CTRL_vol, a row address X-ADDR, and a column address Y-ADDR, for programming data to the memory cell array 110, reading data from the memory cell array 110, or erasing data stored in the memory cell array 110, based on a command CMD, an address ADDR, and a control signal CTRL. Accordingly, the control circuit 122 may generally control various operations in the memory device 100.

The voltage generator 123 may generate various types of voltages for performing program, read, and erase operations on the memory cell array 110, based on the voltage control signal CTRL_vol. In detail, the voltage generator 123 may generate a word line voltage VWL, for example, a program voltage, a read voltage, a pass voltage, an erase verification voltage, a program verification voltage, or the like. The row decoder 124 may select one of a plurality of memory blocks, select one of the word lines WL of the selected memory block, and select one of the plurality of string selection lines SSL, in response to the row address X-ADDR. The page buffer circuit region 121 may select some of the bit lines BL in response to the column address Y-ADDR. In detail, the page buffer circuit region 121 operates as a write driver or a sense amplifier according to an operation mode.

The page buffer circuit region 121 may include a plurality of page buffers PB arranged to correspond to a plurality of bit lines BL, and each page buffer PB may be connected to a single bit line. Each page buffer PB may include a page buffer unit (e.g., any one of PBU0 to PBUn of FIG. 6) and a cache latch (e.g., any one of CL0 to CLn of FIG. 6), and each page buffer unit may include a sensing node. Also, the page buffer units and cache latches of the plurality of page buffers PB may be spaced apart from each other and may have separate structures. Accordingly, the degree of freedom of wirings arranged on the page buffer units may be improved, and the complexity of a layout may be reduced. Also, because the cache latches are arranged adjacent to data input/output lines, a distance between the cache latches and the data input/output lines may be reduced, and thus, a data input/output speed may be improved.

Figure 7:
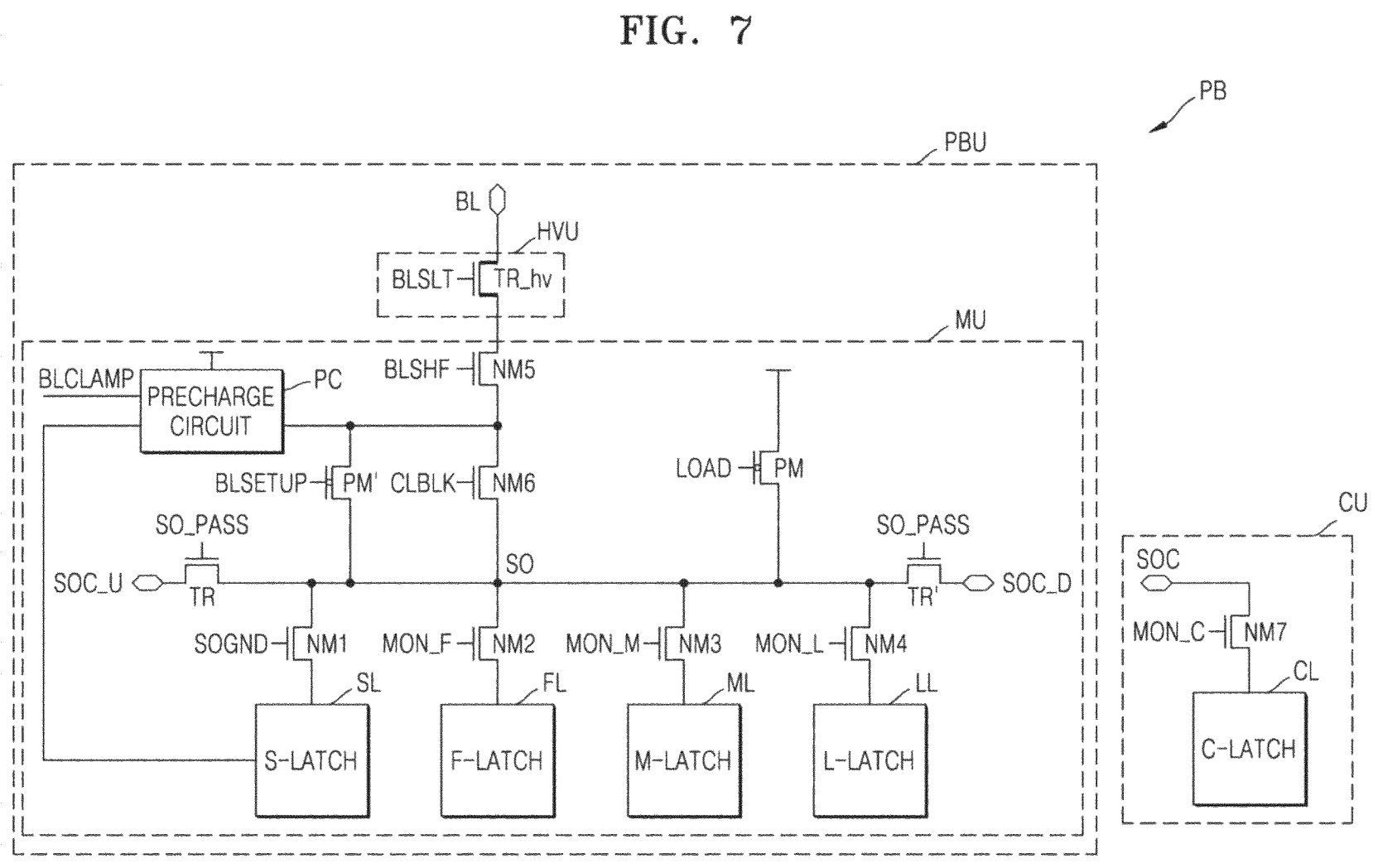

In an embodiment, each page buffer PB (or each page buffer unit) may further include a pair of pass transistors (e.g., TR0 and TR0' of FIG. 7). According to a connection state of the pass transistors of the plurality of page buffers PB, a connection state of the sensing nodes of the page buffers PB may be controlled. For example, all pass transistors of the page buffers PB may be turned on, and thus, all sensing nodes of the page buffers PB may be electrically connected to each other. Alternatively, pass transistors of some of the page buffers PB may be selectively turned on, and thus, only sensing nodes of the some of the page buffers PB may be electrically connected to each other, and electrical connection between the sensing nodes of the some of the page buffers PB and sensing nodes of some others of the page buffers PB may be cut off.

In a data sensing operation, the pass transistors included in each page buffer unit may be turned off, and thus, the sensing nodes included in the plurality of page buffers PB may not be electrically connected to each other. Meanwhile, in a data transfer operation for transferring data between latches, the pass transistors included in each page buffer unit may be turned on, and thus, the sensing nodes included in the plurality of page buffers PB may be electrically connected to each other, thereby being used as data transmission lines. Accordingly, the page buffer circuit region 121 does not need to separately include a plurality of data transmission lines for respectively connecting a plurality of page buffer units to a plurality of cache latches, and thus, an area occupied by the page buffer circuit region 121 may be reduced.

In an embodiment, the control circuit 122 may include a page buffer controller 122_1. The control circuit 122 may control various components included in the page buffer PB in data program and read operations, based on the page buffer controller 122_1. For example, the control circuit 122 may control various switches included in the page buffer PB or may control data transfer (or dump) between a plurality of latches included in the page buffer PB. Also, the control circuit 122 may control data transfer between the latches included in the page buffer PB and input/output lines.

Also, the page buffer PB may perform various types of operation sequences related to a data program and/or read operation. An operation sequence may include one or more periods, and for example, a specific operation sequence may include a precharge period for a sensing node, a discharge period (or develop period), and a sensing period. The precharge period may be an initial phase of a memory operation where the page buffer prepares itself to read or write data. In the precharge period, the sensing node may be reset or precharged to a specific voltage level, which is used as a reference or baseline for a subsequent operation. The precharge period may allow the sensing node to be placed in a known and stable state before the actual data transfer or sensing operation begins. The discharge period may follow the precharge period as a part of the process where the page buffer prepares for reading or writing data. In the discharge period, the page buffer PB may discharge the sensing node to a specific voltage level suitable for an upcoming data operation. The discharge period may prepare the page buffer to accurately detect or write data in the next phase. The sensing period may occur during a read operation in which the page buffer PB reads data. In the sensing period, the page buffer PB may read data from the memory cells, and may store data corresponding to the voltage level (or charge level) of the sensing node in a latch in the page buffer PB.

In describing the following embodiments, various types of operation sequences may be performed in relation to a program and/or read operation of the memory device 100, and the operation sequences may include control operations on the page buffers PB. In describing embodiments, a series of control operations on the page buffer PB may be defined as page buffer operations, and each page buffer operation may include a plurality of periods. Also, when a page buffer circuit includes first to Nth page buffers, an operation sequence will be defined as including first to Nth page buffer operations on the first to Nth page buffers. Furthermore, a page buffer operation according to embodiments may be defined as a concept that includes various other types of periods, in addition to a precharge period, a discharge period, and a sensing period described in the following embodiments.

In an embodiment, a certain number of page buffers PB may be defined as a page buffer circuit, and the page buffers PB in one page buffer circuit may be classified into at least two groups. For example, each page buffer may include eight page buffers PB, and the eight page buffers PB may be classified into two groups, so that each group may include four page buffers PB. In this case, an operation of the page buffers PB may be controlled differently for each group. Also, as a page buffer operation is performed on each of the eight page buffers PB, first to eighth page buffer operations may be performed, and each page buffer operation may include at least one of a precharge period, a discharge period, and a sensing period.

According to an embodiment, assuming that first to fourth page buffers PB are included in a first group and fifth to eighth page buffers PB are included in a second group, only a precharge period and a discharge period may be performed in a page buffer operation of each of the first to fourth page buffers PB, whereas a precharge period, a discharge period, and a sensing period may be performed in a page buffer operation of each of the remaining fifth to eighth page buffers PB. Also, in the sensing period of the page buffer operation of each of the fifth to eighth page buffers PB, a sensing operation on a sensing node of the page buffer PB included in the first group and a sensing operation on a sensing node of the page buffer PB included in the second group may be performed together. Page buffers PB within a plurality of groups may be organized such that immediately adjacent page buffers belong to the same group. For instance, the first to fourth page buffers PB may form the first group, positioned contiguously, while the fifth to eighth page buffers PB may constitute the second group in a similar manner. However, this grouping method is not exclusive, and alternate arrangements are feasible. For example, organizing the page buffers PB into groups may follow a different pattern. One embodiment involves sequentially arranging the first to eighth page buffers PB and categorizing odd-numbered page buffers (first, third, fifth, seventh) into the first group, while even-numbered page buffers (second, fourth, sixth, eighth) form the second group.

According to the above-described embodiment, because a sensing period may be omitted or skipped in page buffer operations of some of the page buffers PB, the time required for all page buffer operations may be reduced, and thus, a data processing speed may be improved.

Meanwhile, in an embodiment, control information for performing an operation sequence in the above-described embodiment may be stored in the memory device 100 in a non-volatile manner. The page buffer controller 122_1 of the memory device 100 may use the control information to perform a control operation on the page buffer circuit region 121. For example, the control information may be stored in the memory cell array 110 or in a separate storage circuit in the memory device 100, and when the memory device 100 is initially driven or activated, the control information may be used to configure environment settings related to an operation sequence of the page buffer circuit region 121. Alternatively, in embodiments, control information may be provided to the memory device 100 from an external device (e.g., a memory controller) when the memory device 100 is initially driven or activated.

Figure 2:
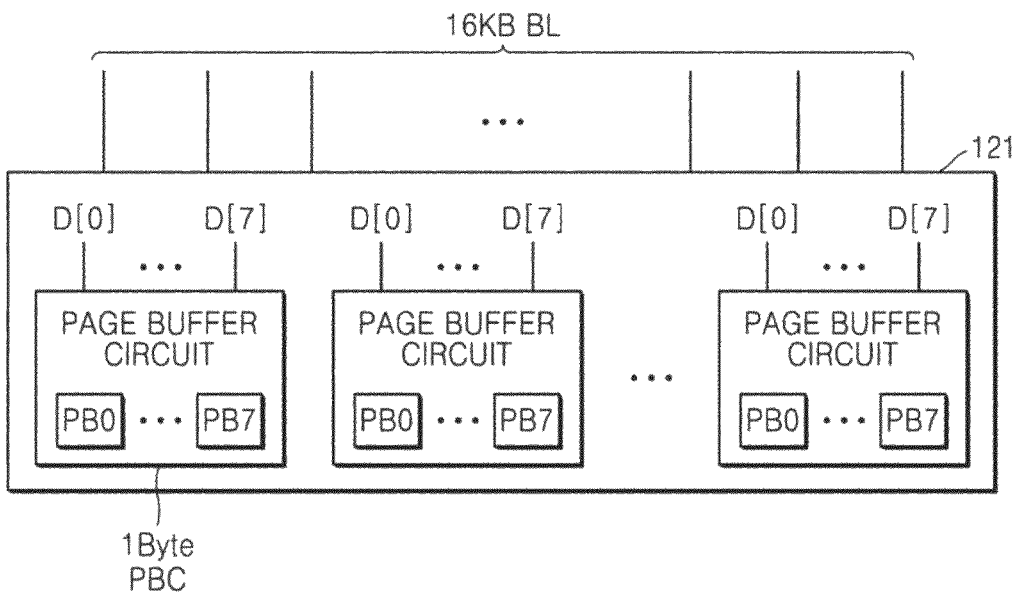
FIG. 2 is a block diagram illustrating an implementation example of a page buffer circuit region of FIG. 1.

FIG. 2 is a block diagram illustrating an implementation example of the page buffer circuit region 121 of FIG. 1.

Referring to FIG. 2, the page buffer circuit region 121 may include the page buffers PB corresponding to the plurality of bit lines BL, and a certain number of page buffers PB may constitute a page buffer circuit PBC. For example, the page buffer circuit region 121 may be connected to the memory cell array 110 through the bit lines BL transferring 16 Kbytes of data, and the page buffer circuit region 121 may include the page buffers PB corresponding to 16 Kbytes. In this case, assuming that the page buffer circuit PBC includes first to eighth page buffers PB0 to PB7 corresponding to 1 byte of data D[0] to D[7], the page buffer circuit region 121 may include 16 K page buffer circuits PBC.

According to embodiments, terms for various components related to the page buffer circuit region 121 may be defined in various ways without being limited to the above-described case. For example, assuming that a page buffer circuit is a component corresponding to all of the plurality of bit lines BL, terms may be defined so as to indicate that the page buffer circuit includes a plurality of page buffer groups, and each page buffer group corresponds to the page buffer circuit PBC illustrated in FIG. 2. In the following embodiments, although components and operations of one page buffer circuit will be described, another page buffer circuit may also include the same components and perform the same operations.

Figure 3:
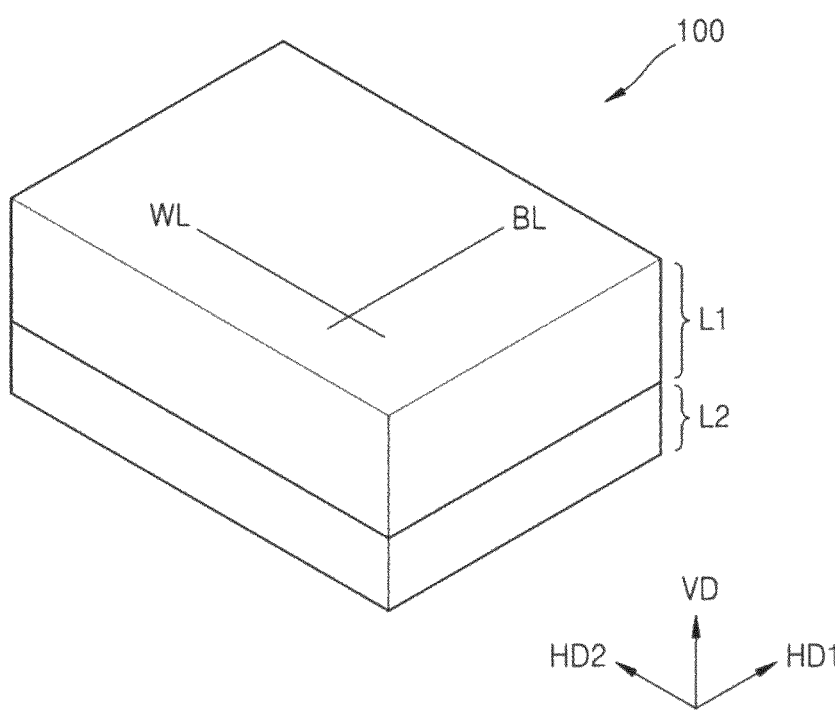
FIG. 3 is a diagram schematically illustrating the structure of the memory device of FIG. 1 according to an embodiment.

FIG. 3 is a diagram schematically illustrating the structure of the memory device 100 of FIG. 1 according to an embodiment.

Referring to FIG. 3, the memory device 100 may include a first semiconductor layer L1 and a second semiconductor layer L2, and the first semiconductor layer L1 may be stacked on the second semiconductor layer L2 in a vertical direction VD. In detail, the second semiconductor layer L2 may be arranged below the first semiconductor layer L1 in the vertical direction VD. In an embodiment, the memory cell array 110 of FIG. 1 may be formed in the first semiconductor layer L1, and the peripheral circuit 120 of FIG. 1 may be formed in the second semiconductor layer L2. Accordingly, the memory device 100 may have a structure in which the memory cell array 110 is arranged above the peripheral circuit 120, that is, a cell over periphery (COP) structure. The COP structure may reduce a horizontal area and may improve the degree of integration of the memory device 100.

In an embodiment, after the peripheral circuit 120 is formed in the second semiconductor layer L2, the first semiconductor layer L1 including the memory cell array 110 may be formed, and metal patterns for electrically connecting the word lines WL and the bit lines BL of the memory cell array 110 to the peripheral circuit 120 formed in the second semiconductor layer L2 may be formed. For example, the bit lines BL may extend in a first horizontal direction or first direction HD1, and the word lines WL may extend in a second horizontal direction or second direction HD2.

With the development of semiconductor processing technology, as the number of memory cells arranged in the memory cell array 110 increases, particularly by stacking more word lines WL, the area of the memory cell array 110 may be reduced, and thus, the area of the peripheral circuit 120 may also be reduced. According to the present embodiment, because the page buffer circuit region 121 has a structure in which a page buffer unit and a cache latch are separated, and sensing nodes included in page buffer units are commonly connected to a combined sensing node, the area occupied by the page buffer circuit region 121 may be reduced.

Figure 4:
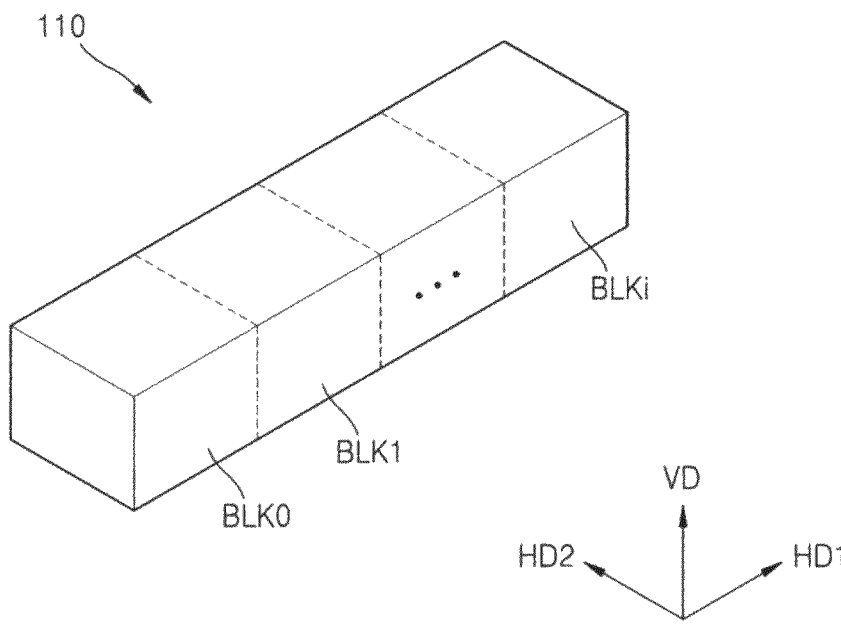
FIG. 4 is a diagram illustrating an example of a memory cell array of FIG. 1 according to an embodiment.

FIG. 4 is a diagram illustrating an example of the memory cell array 110 of FIG. 1 according to an embodiment.

Referring to FIG. 4, the memory cell array 110 may include a plurality of memory blocks BLK0 to BLKi, and i may be a positive integer. Each of the plurality of memory blocks BLK0 to BLKi may have a three-dimensional structure (or vertical structure). Each of the plurality of memory blocks BLK0 to BLKi may include a plurality of NAND strings extending in the vertical direction VD. In particular, the plurality of NAND strings may be arranged apart from each other by a certain distance in the first and second directions HD1 and HD2.

Figure 5:
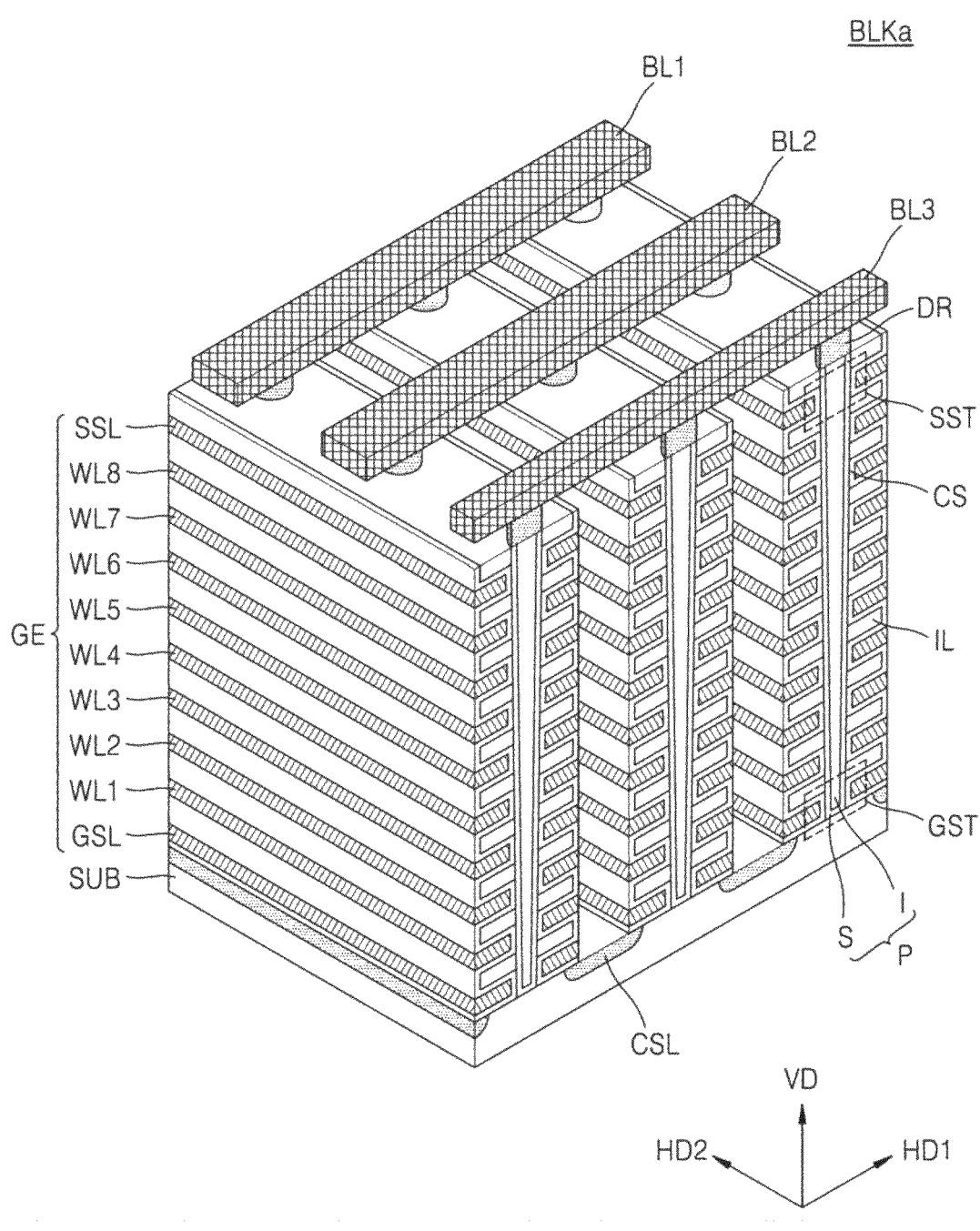
FIG. 5 is a perspective view illustrating a memory block according to an embodiment.

FIG. 5 is a perspective view illustrating a memory block BLKa according to an embodiment.

Referring to FIG. 5, the memory block BLKa may correspond to one of the plurality of memory blocks BLK0 to BLKi in FIG. 4. The memory block BLKa is formed in the vertical direction VD with respect to a substrate SUB having a first conductivity type (e.g., a p-type). In an embodiment, a common source line CSL doped with impurities of a second conductivity type (e.g., an n-type) may be provided to the substrate SUB. In one embodiment, the substrate SUB may include polysilicon, and the common source line CSL having a plate shape may be arranged on the substrate SUB. A plurality of insulating layers IL extending in the second direction HD2 are sequentially provided on the substrate SUB in the vertical direction VD, and the plurality of insulating layers IL are arranged apart from each other by a certain distance in the vertical direction VD. For example, the plurality of insulating layers IL may include an insulating material, such as silicon oxide.

A plurality of pillars P sequentially arranged in the first direction HD1 and passing through the plurality of insulating layers IL in the vertical direction VD are provided on the substrate SUB. For example, the plurality of pillars P may pass through the plurality of insulating layers IL to be in contact with the substrate SUB. Specifically, a surface layer S of each pillar P may include a silicon material of a first type and may function as a channel region. Accordingly, the pillar P may be referred to as a vertical channel structure. Meanwhile, an inner layer I of each pillar P may include an insulating material, such as silicon oxide, or an air gap.

A charge storage layer CS is provided along exposed surfaces of the insulating layers IL, the pillars P, and the substrate SUB. The charge storage layer CS may include a gate insulating layer, a charge trap layer, and a blocking insulating layer. For example, the charge storage layer CS may have an oxide-nitride-oxide (ONO) structure. Also, a gate electrode GE, including the ground selection line GSL, the string selection line SSL, and word lines WL1 to WL8, are provided on an exposed surface of the charge storage layer CS. Drains DR are provided on the plurality of pillars P, respectively. For example, the drains DR may include a silicon material doped with impurities having a second conductivity type. Bit lines BL1 to BL3 extending in the first direction HD1 and arranged apart from each other by a certain distance in the second direction HD2 are provided on the drains DR.

Figure 6:
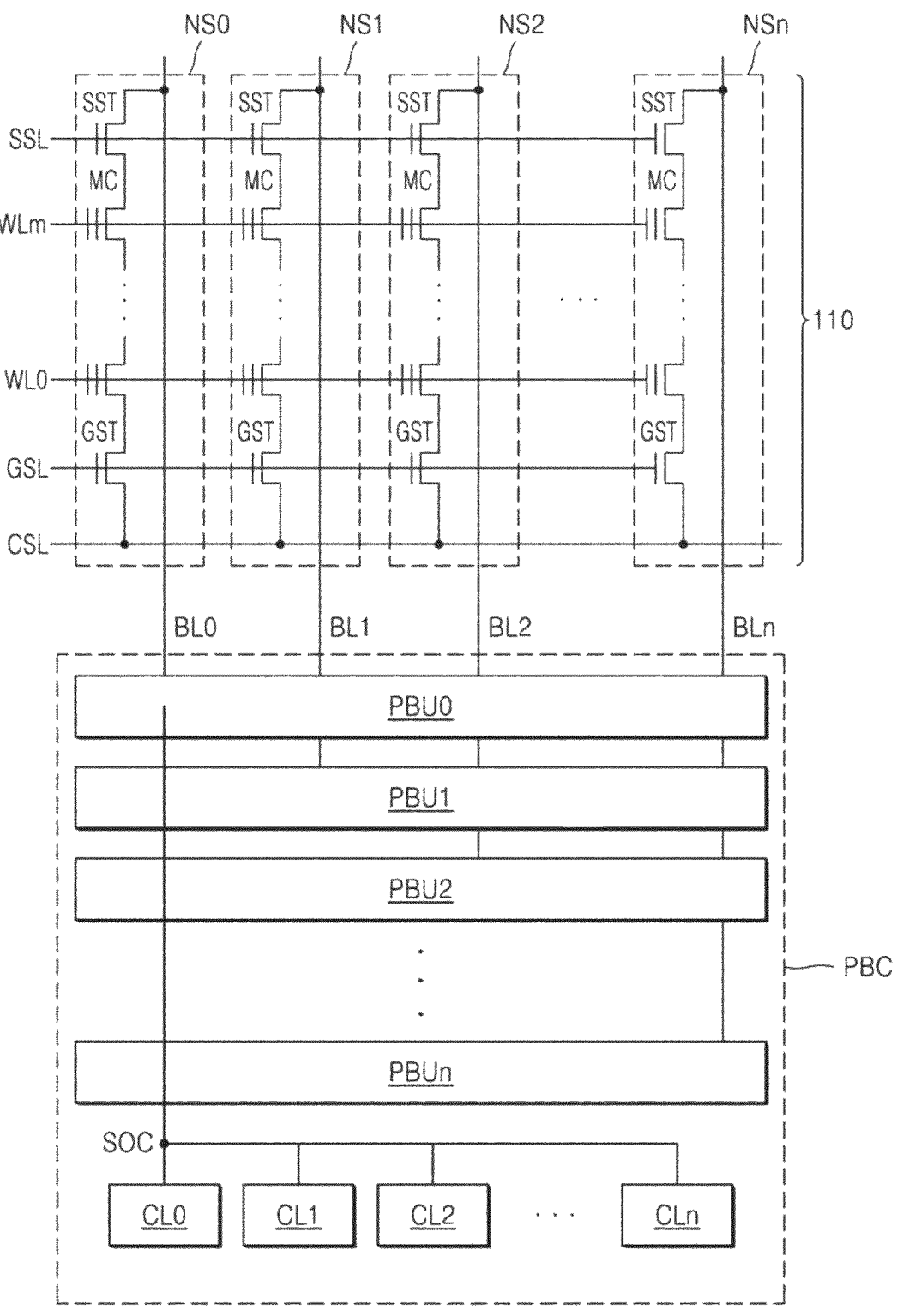
FIG. 6 is a diagram illustrating connection between a memory cell array and a page buffer circuit region according to an embodiment.

FIG. 6 is a diagram illustrating connection between the memory cell array 110 and a page buffer circuit according to an embodiment. FIG. 6 illustrates one page buffer circuit PBC among a plurality of page buffer circuits provided in the page buffer circuit region. Also, regarding a sensing node in a page buffer, the sensing node may be described as being included in the page buffer, or the sensing node may be described as being included in a page buffer unit.

Referring to FIG. 6, the memory cell array 110 may include first to n+1th NAND strings NS0 to NSn, each of the first to n+1th NAND strings NS0 to NSn may include a ground selection transistor GST connected to the ground selection line GSL, a plurality of memory cells MC respectively connected to a plurality of word lines WL0 to WLm, and a string selection transistor SST connected to the string selection line SSL, and the plurality of memory cells MC and the string selection transistor SST may be connected to each other in series.

The page buffer circuit PBC may include first to n+1th page buffers, and the first to n+1th page buffers may include first to n+1th page buffer units PBU0 to PBUn. The first page buffer unit PBU0 may be connected to the first NAND string NS0 through a first bit line BL0, and the n+1th page buffer unit PBUn may be connected to the n+1th NAND string NSn through a n+1th bit line BLn. For example, n may be 7, and the page buffer circuit PBC may have a structure in which eight levels of the first to n+1th page buffer units PBU0 to PBUn are arranged in a row. For example, the first to n+1th page buffer units PBU0 to PBUn may be arranged in a row in an extension direction of the first to n+1th bit lines BL0 to BLn.

The page buffer circuit PBC may further include first to n+1th cache latches CL0 to CLn corresponding to the first to n+1th page buffer units PBU0 to PBUn. For example, n may be 7, and the page buffer circuit PBC may have a structure in which eight levels of the first to n+1th cache latches CL0 to CLn are arranged in a row. For example, the first to n+1th cache latches CL0 to CLn may be arranged in a row in the extension direction of the first to n+1th bit lines BL0 to BLn.

Sensing nodes of the first to n+1th page buffer units PBU0 to PBUn may be commonly connected to a combined sensing node SOC. Also, the first to n+1th cache latches CL0 to CLn may be commonly connected to the combined sensing node SOC. Accordingly, the first to n+1th page buffer units PBU0 to PBUn may be connected to the first to n+1th cache latches CL0 to CLn through the combined sensing node SOC. In an implementation example, the sensing nodes of the first to n+1th page buffer units PBU0 to PBUn may be connected in series to the combined sensing node SOC as pass transistors included in each page buffer unit are turned on. Also, the first to n+1th cache latches CL0 to CLn may be connected in parallel with each other to the combined sensing node SOC.

In an embodiment, when all pass transistors of the first to n+1th page buffer units PBU0 to PBUn are turned on, the sensing nodes of the first to n+1th page buffer units PBU0 to PBUn may be electrically connected to each other. Also, when the page buffers are classified into at least two groups, pass transistors of page buffer units of a first group of may be turned off, whereas when pass transistors of page buffer units of a second group are turned on, only sensing nodes of the page buffer units of the second group may be selectively connected to each other. According to the above-described control, a capacitance value of a sensing node in a page buffer operation on the first group may be set differently from a capacitance value of a sensing node in a page buffer operation on the second group. In an operation example, in classifying a plurality of page buffers into at least two groups, page buffers of two or more levels located adjacent to each other may be classified into one group.

FIG. 7 is a circuit diagram illustrating in detail the page buffer PB according to an embodiment.

The page buffer PB illustrated in FIG. 7 may be an exemplary implementation of the page buffer PB of FIG. 1. The page buffer PB may include a page buffer unit PBU and a cache unit CU. The cache unit CU may include a cache latch CL, and because the cache latch CL is connected to a data input/output line, the cache unit CU may be arranged adjacent to the data input/output line. Accordingly, the page buffer unit PBU and the cache unit CU may be arranged apart from each other, and the page buffer PB may have a structure in which the page buffer unit PBU and the cache unit CU separated.

The page buffer unit PBU may include a main unit MU. The main unit MU may include one or more latches and one or more transistors. The page buffer unit PBU may further include a bit line selection transistor TR_hv connected to the bit line BL and driven by a bit line selection signal BLSLT. The bit line selection transistor TR_hv may be implemented as a high voltage transistor, and thus, the bit line selection transistor TR_hv may be arranged in a well region different from the main unit MU, that is, in a high voltage unit HVU.

The main unit MU may include a sensing latch SL, a force latch FL, an upper bit latch ML, and a lower bit latch LL. According to an embodiment, the sensing latch SL, the force latch FL, the upper bit latch ML, or the lower bit latch LL may be referred to as a "main latch." The main unit MU may further include a precharge circuit PC capable of controlling a precharge operation on the bit line BL or a sensing node SO, based on a bit line clamping control signal BLCLAMP, and may further include a transistor PM' driven by a bit line setup signal BLSETUP.

The sensing latch SL may store data stored in a memory cell or a sensing result of a threshold voltage of a memory cell during a read or program verify operation. Also, the sensing latch SL may be used to apply a program bit line voltage or a program inhibit voltage to the bit line BL during a program operation. The force latch FL may be used to improve threshold voltage distribution during a program operation. In detail, the force latch FL may store force data. The force data may initially be set to '1' and then changed to '0' when a threshold voltage of a memory cell enters a forcing area that is lower than a target area. By using the force data, during a program execution operation, a bit line voltage may be controlled, and program threshold voltage distribution may be formed more narrowly.

The upper bit latch ML, the lower bit latch LL, and the cache latch CL may be used to store externally input data during a program operation and may be referred to as "data latches." When programming 3 bits of data in one memory cell, the 3 bits of data may be stored in the upper bit latch ML, the lower bit latch LL, and the cache latch CL, respectively. Until programming of the memory cell is completed, the upper bit latch ML, the lower bit latch LL, and the cache latch CL may retain data stored therein. Also, the cache latch CL may receive data read from a memory cell during a read operation from the sensing latch SL and may output the data to the outside through a data input/output line.

Also, the main unit MU may further include first to fourth transistors NM1 to NM4. The first transistor NM1 may be connected between the sensing node SO and the sensing latch SL and may be driven by a ground control signal SOGND. The second transistor NM2 may be connected between the sensing node SO and the force latch FL and may be driven by a forcing monitoring signal MON_F. The third transistor NM3 may be connected between the sensing node SO and the upper bit latch ML and may be driven by an upper bit monitoring signal MON_M. The fourth transistor NM4 may be connected between the sensing node SO and the lower bit latch LL and may be driven by a lower bit monitoring signal MON_L.

Also, the main unit MU may further include fifth and sixth transistors NM5 and NM6 connected in series between the bit line selection transistor TR_hv and the sensing node SO. The fifth transistor NM5 may be driven by a bit line shut-off signal BLSHF, and the sixth transistor NM6 may be driven by a bit line connection control signal CLBLK. Also, the main unit MU may further include a precharge transistor PM. The precharge transistor PM is connected to the sensing node SO, is driven by a load signal LOAD, and precharges the sensing node SO to a precharge level in a precharge period.

In an embodiment, the main unit MU may further include a pair of pass transistors, that is, first and second pass transistors TR and TR', connected to the sensing node SO. According to an embodiment, the first and second pass transistors TR and TR' may be referred to as "first and second sensing node connection transistors." The first and second pass transistors TR and TR' may be driven according to a pass control signal SO_PASS. According to an embodiment, the pass control signal SO_PASS may be referred to as a "sensing node connection control signal." In detail, the first pass transistor TR may be connected between a first terminal SOC_U and the sensing node SO, and the second pass transistor TR' may be connected between the sensing node SO and a second terminal SOC_D.

For example, when the page buffer unit PBU is the second page buffer unit PBU1 of FIG. 6, the first terminal SOC_U may be connected to one end of a pass transistor included in the first page buffer unit PBU0, and the second terminal SOC_D may be connected to one end of a pass transistor included in the third page buffer unit PBU3. Accordingly, the sensing node SO of the second page buffer unit PBU1 may be electrically connected to the combined sensing node SOC through pass transistors included in each of the third to n+1th page buffer units PBU2 to PBUn.

The page buffer PB may perform a page buffer operation for verifying whether or not programming of a selected memory cell among memory cells included in a NAND string connected to the bit line BL is completed during a program operation. For example, in a program verification operation, a precharge operation may be performed on the sensing node SO of the page buffer PB, a discharge operation may be performed according to data stored in the selected memory cell, and a sensing operation may be performed to store data sensed through the sensing node SO in the sensing latch SL. According to the data stored in the sensing latch SL, the upper bit latch ML and the lower bit latch LL, in which target data is stored, may be set. For example, when the sensed data indicates that the programming is completed, the upper bit latch ML and the lower bit latch LL may be switched to a program inhibit setting for the selected memory cell in the subsequent program loop.

Alternatively, in a program operation or a read operation, the page buffer PB may perform a page buffer operation for storing data in the sensing latch SL according to data stored in the cache latch CL. For example, a precharge operation may be performed on the sensing node SO of the page buffer PB, a discharge operation may be performed on the sensing node SO according to the data stored in the cache latch CL, and a sensing operation may be performed to store data sensed through the sensing node SO in the sensing latch SL. In the above-described example of a page buffer operation, it has been described that the data sensed through the sensing node SO is stored in the sensing latch SL, but embodiments are not necessarily limited thereto. The data sensed through the sensing node SO may also be stored in another latch in the main unit MU.

Figure 8:
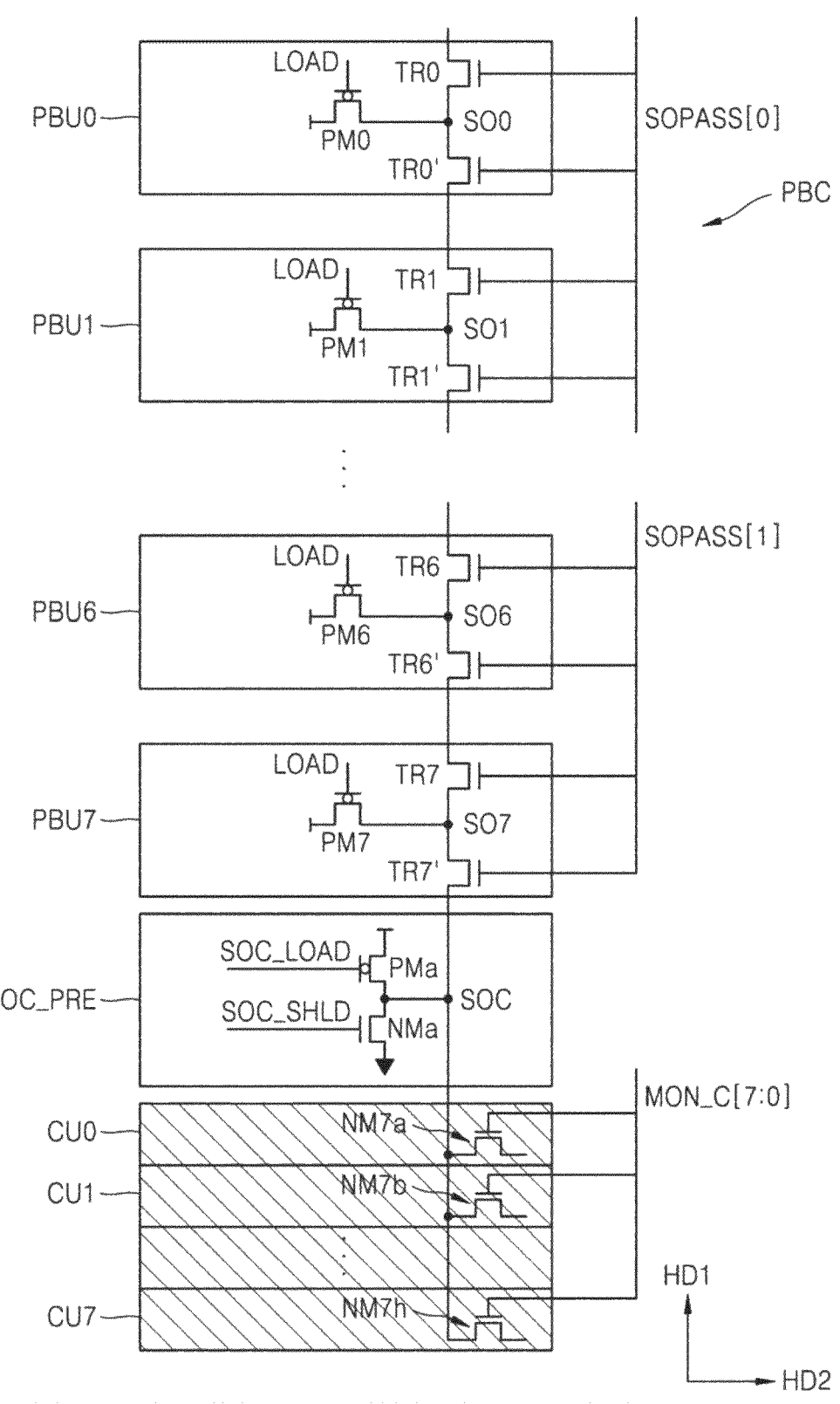
FIG. 8 is a circuit diagram illustrating an implementation example of a page buffer circuit of FIG. 6.

FIG. 8 is a circuit diagram illustrating an implementation example of the page buffer circuit PBC of FIG. 6 Hereinafter, the configuration of the page buffer circuit PBC will be described in detail with reference to FIGS. 6 to 8.

Each page buffer unit may include two pass transistors, and when the page buffer circuit PBC includes eight page buffers, the page buffer circuit PBC may include 16 pass transistors, that is, first pass transistors TR0 to TR7 and second pass transistors TR0' to TR7', which may be connected to each other in series. Although not illustrated in FIG. 8, each page buffer unit may further include a plurality of latches and a plurality of transistors as described in the above-described embodiments. For example, the first page buffer unit PBU0 may further include a plurality of transistors (e.g., the transistors included in the sensing latch SL, the force latch FL, the upper bit latch ML, and the lower bit latch LL of FIG. 7, the first to sixth transistors NM1 to NM6, etc.)

connected between the first pass transistor TR0 and the second pass transistor TR0' and arranged in the first horizontal direction HD1. Also, each of the second to eighth page buffer units PBU1 to PBU7 may be implemented identically or similarly to the first page buffer unit PBU0 described above.

Also, each page buffer unit may include a precharge transistor, and first to eighth precharge transistors PM0 to PM7 may be included in the page buffer circuit PBC to correspond to the first to eighth page buffer units PBU0 to PBU7. For example, in the first page buffer unit PBU0, the first precharge transistor PM0 may be connected between a first sensing node SO0 and a voltage terminal to which a precharge level is applied and may have a gate to which the load signal LOAD is applied. The first precharge transistor PM0 may precharge the first sensing node SO0 to a precharge level in response to the load signal LOAD.

The page buffer circuit PBC may further include a precharge circuit SOC_PRE located between the eighth page buffer unit PBU7 and a first cache unit CU0. The precharge circuit SOC_PRE may include a precharge transistor PMa for precharging the combined sensing node SOC, and a shielding transistor NMa. The precharge transistor PMa may be driven by a combined sensing node load signal SOC_LOAD, and when the precharge transistor PMa is turned on, the combined sensing node SOC may be precharged to a precharge level. The shielding transistor NMa may be driven by a combined sensing node shielding signal SOC_SHLD, and when the shielding transistor NMa is turned on, the combined sensing node SOC may be discharged to a ground level.

Meanwhile, each cache unit may include a monitor transistor. For example, first to eighth monitor transistors NM7a to NM7h included in the page buffer circuit PBC may correspond to the first to eighth cache units CU0 to CU7. The first to eighth monitor transistors NM7a to NM7h may be connected in parallel to the combined sensing node SOC and may be controlled by cache monitoring signals MON_C [7:0]. Also, according to a logic level of the cache monitoring signals MON_C[7:0], electrical connection between cache latches in the first to eighth cache units CU0 to CU7 and the combined sensing node SOC may be controlled.

According to the above-described implementation example of the page buffer circuit PBC in the present embodiment, the separate arrangement of page buffer units and cache units provides greater flexibility for the design of metal patterns in one or more metal layers arranged above the page buffer units. Also, in a structure in which the first to eighth page buffer units PBU0 to PBU7 and the first to eighth cache units CU0 to CU7 are separated, the first to eighth sensing nodes SO0 to SO7 may be connected to each other by using the first transistors TR0 to TR7 and the second pass transistors TR0' to TR7', respectively included in the first to eighth page buffer units PBU0 to PBU7, and the first to eighth sensing nodes SO0 to SO7 may be connected to the first to eighth cache units CU0 to CU7 through the combined sensing node SOC. That is, without the need to include a plurality of metal lines arranged side by side in the second horizontal direction HD2 to separately connect each of the first to eighth sensing nodes SO0 to SO7 to the combined sensing node SOC, the first to eighth sensing nodes SO0 to SO7 may be connected in series to the combined sensing node SOC in the first horizontal direction HD1, and thus, an increase in the size of the page buffer circuit PBC in the second horizontal direction HD2 may be prevented.

Meanwhile, according to embodiments, the first to eighth page buffers may be classified into two groups. For example, the first to fourth page buffers may be classified into a first group, and the remaining fifth to eighth page buffers may be classified into a second group. Also, the same pass control signal may be provided to page buffers included in each group. For example, a first pass control signal SOPASS[0] may be provided to the first pass transistors TR0 to TR3 and the second pass transistors TR0' to TR3' included in the first to fourth page buffer units PBU0 to PBU3 of the page buffers of the first group, and a second pass control signal SOPASS[1] may be provided to the first pass transistors TR4 to TR7 and the second pass transistors TR4' to TR7' included in the fifth to eighth page buffer units PBU4 to PBU7 of the page buffers of the second group.

A page buffer operation according to embodiments may include one or more of a precharge period, a discharge period, and a sensing period. The page buffer circuit PBC may include the first to eighth page buffers, a page buffer operation may be performed for each page buffer, and thus, any one operation sequence of the page buffer circuit PBC may include first to eighth page buffer operations. According to embodiments, a sensing period may be skipped in some page buffer operations, and sensing operations on at least two page buffers may be performed together in a sensing period of some other page buffer operations.

In an operation example, regarding the first page buffer operation on the first page buffer of the first group, in a precharge period, the first to eighth sensing nodes SO0 to SO7 may be precharged to a precharge level as the first to eighth precharge transistors PM0 to PM7 are turned on, the first pass transistors TR0 to TR7 and the second pass transistors TR0' to TR7' may be turned on as the first pass control signal SOPASS[0] and the second pass control signal SOPASS[1] have a logic high level, and the first to eighth sensing nodes SO0 to SO7 may be electrically connected to each other. Then, in a discharge period, a voltage level of the first sensing node SO0 may be changed as the first sensing node SO0 is discharged through a path including the second to eighth sensing nodes SO1 to SO7. For example, the degree of reduction in voltage level may vary according to data stored in a cache latch of the first cache unit CU0. Thereafter, as the first pass control signal SOPASS[0] and the second pass control signal SOPASS[1] are changed to a logic low level and the first pass transistors TR0 to TR7 and the second pass transistors TR0' to TR7' are turned off, the first sensing node SO0 may be changed to a floating state, and the first sensing node SO0 may maintain the voltage level changed in the discharge period.

Meanwhile, in the above-described first page buffer operation, a sensing period may be skipped, and then, proceeds to the fifth page buffer operation, which pertains to the fifth page buffer of the second group. Regarding the fifth page buffer operation, in a precharge period, as the fifth to eighth precharge transistors PM4 to PM7 are selectively turned on, only the fifth to eighth sensing nodes SO4 to SO7 may be selectively precharged to a precharge level. Also, the first pass control signal SOPASS[0] may maintain a logic low level, whereas the second pass control signal SOPASS[1] may be changed to a logic high level, and thus, the first pass transistors TR4 to TR7 and the second pass transistors TR4' to TR7' of the fifth to eighth page buffers may be turned on. Accordingly, whereas the fifth to eighth sensing nodes SO4 to SO7 may be electrically connected to each other, the fourth sensing node SO3 and the fifth sensing node SO4 may be electrically separated from each other. That is, the fifth sensing node SO4 may be electrically separated from the first to fourth sensing nodes SO0 to SO3.

Thereafter, in a discharge period, the fifth sensing node SO4 may be discharged through a path including the sixth to eighth sensing nodes SO5 to SO7, and a voltage level of the fifth sensing node SO4 may be changed according to data stored in a cache latch of a fifth cache unit CU4. Then, as the first pass transistors TR4 to TR7 and the second pass transistors TR4' to TR7' are turned off, the fifth sensing node SO4 may be changed to a floating state, and the fifth sensing node SO4 may maintain the voltage level changed in the discharge period.

Thereafter, in the fifth page buffer operation, a sensing period may be performed, and during the sensing period, sensing operations on the first sensing node SO0 and the fifth sensing node SO4 may be performed together. For example, in the sensing period, through control of a sensing latch included in the first page buffer unit PBU0, the first sensing node SO0 and the sensing latch of the first page buffer unit PBU0 may be electrically connected to each other, and data having a logic value according to a voltage level of the first sensing node SO0 may be stored in the sensing latch. Also, through control of a sensing latch included in the fifth page buffer unit PBU4, the fifth sensing node SO4 and the sensing latch of the fifth page buffer unit PBU4 may be electrically connected to each other, and data having a logic value according to a voltage level of the fifth sensing node SO4 may be stored in the sensing latch.

Page buffer operations may also be performed on the remaining page buffers in a manner the same as or similar to the above-described operation. For example, the above-described page buffer operations may be performed on the second page buffer of the first group and the sixth page buffer of the second group, and then, the above-described page buffer operations may be performed on the third page buffer of the first group and the seventh page buffer of the second group, and thereafter, the above-described page buffer operations may be performed on the fourth page buffer of the first group and the eighth page buffer of the second group. When the page buffer operations on the first to eighth page buffers are completed as described above, data may be stored in each of sensing latches of the first to eighth page buffer units PBU0 to PBU7, and a data program and/or read operation may be performed based on the stored data.

Figure 9:
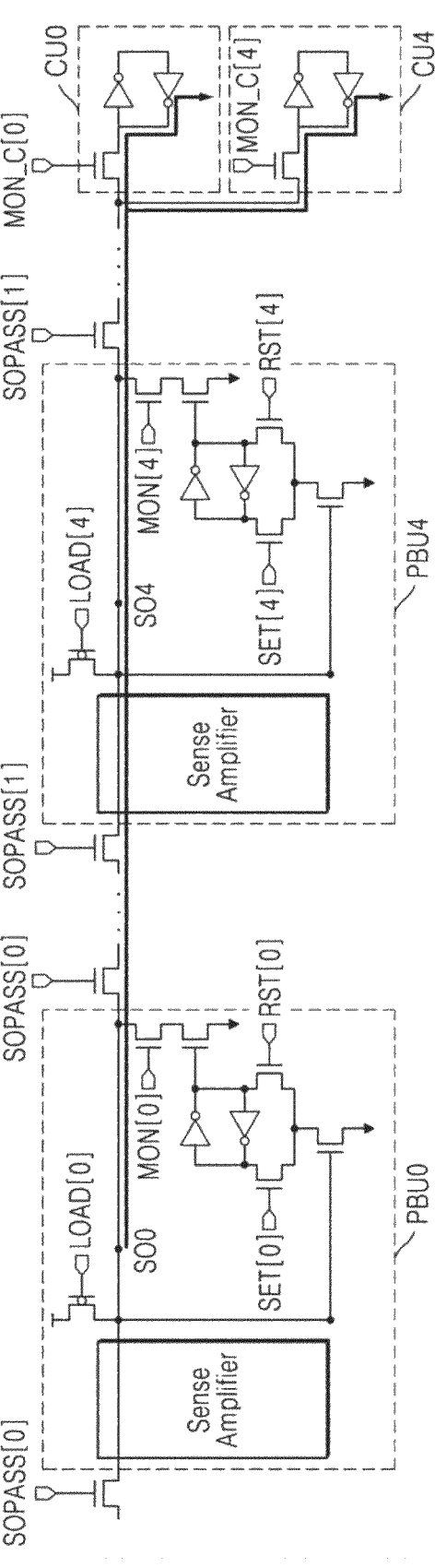
FIGS. 9 to 11 are diagrams illustrating an implementation example and an operation example of a page buffer circuit according to embodiments.
Figure 10:
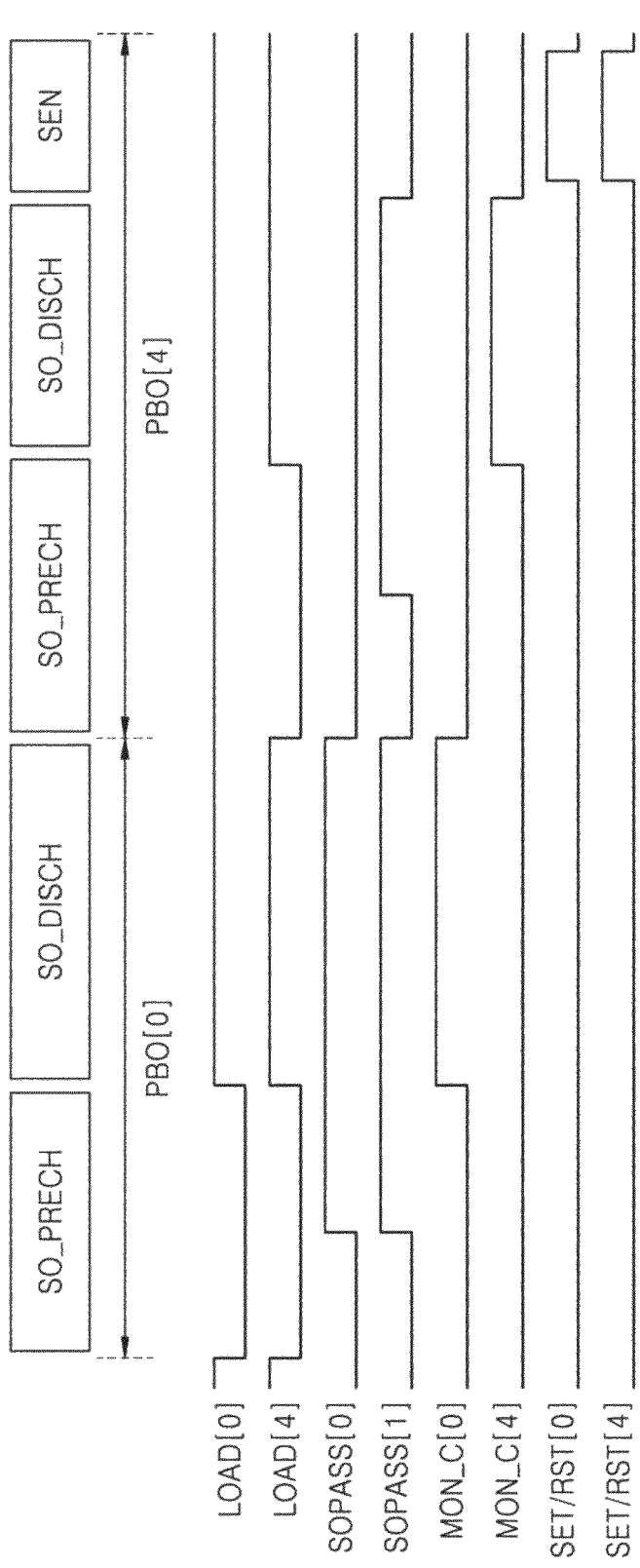
Figure 11:
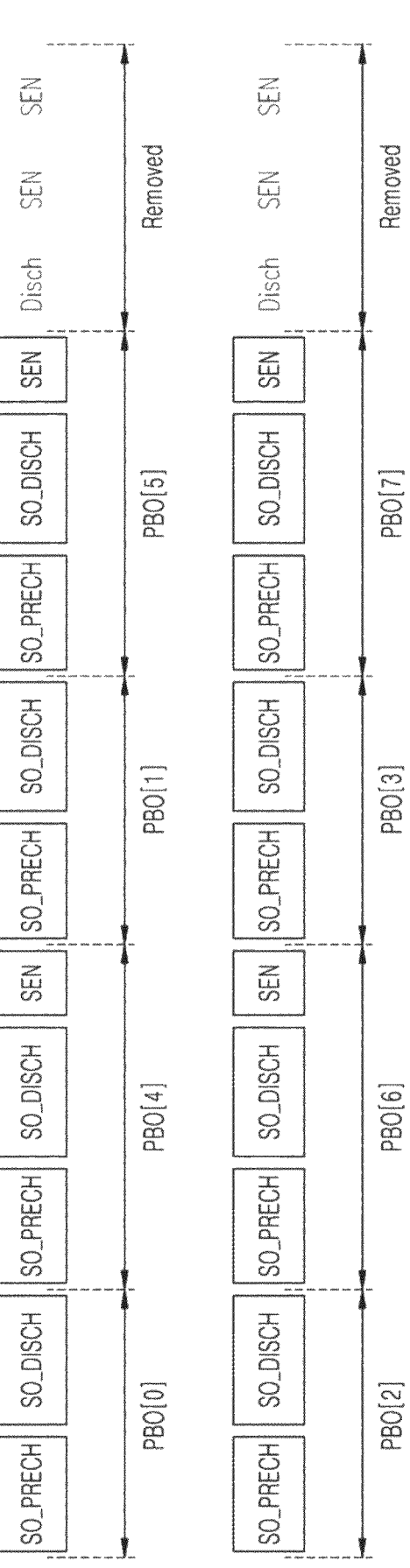

Hereinafter, a specific operation of a memory device according to embodiments will be illustrated. FIGS. 9 to 11 are diagrams illustrating an implementation example and an operation example of a page buffer circuit according to embodiments. The operation sequence described in the embodiment of FIGS. 9 to 11 illustrates an operation example in which data stored in a cache latch is transferred to a sensing latch.

Referring to FIG. 9, the memory device may include a plurality of page buffer circuits, and each page buffer circuit may include a plurality of page buffers. For example, a page buffer circuit may include first to eighth page buffers, each page buffer may include page buffer units and cache units that are physically separated from each other as described in the above-described embodiments, and the page buffer units of the plurality of page buffer circuits may have a structure in which a combined sensing node is shared between the page buffer units.

According to embodiments, the plurality of page buffers may be classified into at least two groups. FIG. 9 schematically illustrates the first page buffer unit PBU0 and the first cache unit CU0 of the first page buffer belonging to a first group, and the fifth page buffer unit PBU4 and the fifth cache unit CU4 of the fifth page buffer belonging to a second group. Also, each page buffer may include pass transistors (e.g., two pass transistors), a pass transistor of the first page buffer may receive the first pass control signal SOPASS[0], and a pass transistor of the fifth page buffer may receive the second pass control signal SOPASS[1]. Also, FIG. 9 illustrates an implementation example of a sensing latch included in each page buffer unit and having a sense amplifier and illustrates that the page buffer units and the cache units have physically separated structures, and thus, the first cache unit CU0 and the fifth cache unit CU4 are located together on the right side of the drawing.

An operation example of the page buffer circuit illustrated in FIG. 9 will be described with reference to FIG. 10 as follows.

First to eighth page buffer operations PB0[0] to PB0[7] corresponding to the first to eighth page buffers may be performed, and each page buffer operation may include at least one of a precharge period, a discharge period, and a sensing period. According to embodiments, a sensing period may be skipped in some page buffer operations of the first to eighth page buffer operations, whereas in sensing periods of some other page buffer operations of the first to eighth page buffer operations, sensing operations on sensing nodes of at least two page buffers may be performed together. Accordingly, because one or more sensing periods may be skipped in the entire operation sequence, the time required for the entire operation sequence may be reduced.

For example, regarding the first page buffer operation PB0[0] for the first page buffer, in a precharge period, a first load signal LOAD[0] and a fifth load signal LOAD[4] may be changed to logic low, which is an enable level, and thus, a sensing node of the first page buffer and a sensing node of the fifth page buffer may be precharged. Although not illustrated in FIG. 10, precharge transistors in the other page buffers may be turned on, and according to an embodiment, all precharge transistors included in the first to eighth page buffers may be turned on. Also, in the precharge period, the first pass control signal SOPASS[0] and the second pass control signal SOPASS[1] may be changed to logic high, which is an enable level, and thus, sensing nodes of the first to eighth page buffers may be electrically connected to each other through pass transistors of the first to eighth page buffers. Although FIG. 10 illustrates that the first and second pass control signals SOPASS[0] and SOPASS[1] are enabled after a certain time has elapsed after the precharge period starts, but embodiments are not necessarily limited thereto. For example, the first and second pass control signals SOPASS[0] and SOPASS[1] may be enabled at the start of the precharge period or may be enabled at any point after the precharge period starts.

Thereafter, in a discharge period of the first page buffer operation PB0[0], the first load signal LOAD[0] and the fifth load signal LOAD[4] may be changed to a logic high level, and the first and second pass control signals SOPASS[0] and SOPASS[1] may maintain a logic high state. Accordingly, the sensing node of the first page buffer may be electrically connected to a combined sensing node through the sensing nodes of the second to eighth page buffers, the first cache monitoring signal MON_C[0] may be changed to logic high, which is an enable level, and thus, the sensing node of the first page buffer may be discharged according to a value of data stored in a first cache latch. As illustrated with a dotted line in FIG. 9, the sensing node of the first page buffer may be discharged through a ground terminal included in the first cache latch.

Thereafter, a precharge period of the fifth page buffer operation PB0[4] may be performed after omitting the sensing period of the first page buffer operation PB0[0]. In the precharge period of the fifth page buffer operation PB0[4], the first load signal LOAD[0] may maintain a logic high level, whereas the fifth load signal LOAD[4] may be changed to a logic low level, which is an enable level, and thus, the sensing node of the fifth page buffer may be precharged. For example, load signals provided to the fifth to eighth page buffers may be changed together to a logic low level, which is an enable level.

Also, in the precharge period of the fifth page buffer operation PB0[4], only the second pass control signal SOPASS[1] may be changed to logic high, which is an enable level, and thus, the sensing nodes of the fifth to eighth page buffers may be electrically connected to each other, whereas electrical connection between the sensing node of the fourth page buffer and the sensing node of the fifth page buffer may be cut off. Accordingly, the sensing node of the fifth page buffer may be electrically separated from the sensing nodes of the first to fourth page buffers, whereas the sensing node of the fifth page buffer may be connected to the combined sensing node through the sensing nodes of the sixth to eighth page buffers.

Thereafter, in a discharge period of the fifth page buffer operation PB0[4], the fifth load signal LOAD[4] may be changed to a logic high level, and the second pass control signal SOPASS[1] may maintain a logic high state. Also, a fifth cache monitoring signal MON_C[4] may be changed to logic high, which is an enable level, and thus, the sensing node of the fifth page buffer may be discharged according to a value of data stored in a fifth cache latch. For example, the sensing node of the fifth page buffer may be discharged through a path including the sensing nodes of the sixth to eighth page buffers. For example, as illustrated with a dotted line in FIG. 9, the sensing node of the fifth page buffer may be discharged through a ground terminal included in the fifth cache latch.

Thereafter, in a sensing period of the fifth page buffer operation PB0[4], the second pass control signal SOPASS[1] may be changed to a logic low level, which is a disable level, and the sensing node of the fifth page buffer may be changed to a floating state. Also, a voltage of the sensing nodes of the first and fifth page buffers may be maintained at a level according to a discharge result, a monitor transistor may be turned on in response to first and fifth monitor control signals MON[0] and MON[4], and thus, data according to the voltage levels of the sensing nodes of the first and fifth page buffers may be stored in sensing latches of the first and fifth page buffers. For example, the sensing latch of each page buffer may include transistors that receive a set/reset signal, along with a pair of buffers (or inverters) that form a latch structure, and in the sensing period, at least one of set/reset signals SET/RST[0] provided to the sensing latch of the first page buffer may be changed to logic high, which is an enable level. Also, in the sensing period, at least one of set/reset signals SET/RST[4] provided to the sensing latch of the fifth page buffer may be changed to logic high, which is an enable level.

According to the embodiment as described above, because a sensing period may be skipped in four page buffer operations of the first to eighth page buffer operations, the time required for the entire operation sequence related to a program/read operation of data may be reduced, and thus, the performance of the program/read operation of data may be improved.

Meanwhile, FIG. 11 schematically illustrates the entire operation sequence of the first to eighth page buffer operations.

The first page buffer operation PB0[0] may include a precharge period and a discharge period in relation to the first page buffer. Also, the fifth page buffer operation PB0[4] may include a precharge period, a discharge period, and a sensing period in relation to the fifth page buffer. Also, in the sensing period of the fifth page buffer operation PB0[4], operations of sensing voltage levels of the sensing nodes of the first and fifth page buffers storing sensing results in the sensing latches of the first and fifth page buffers may be performed together.

Meanwhile, as described in the above-described embodiments of FIGS. 9 and 10, in the discharge period of the fifth page buffer operation PB0[4], only the second pass control signal SOPASS[1] may be changed to a logic high level, which is an enable level, and thus, the sensing nodes of the fifth to eighth page buffers may be electrically connected to each other, whereas the sensing node of the fifth page buffer and the sensing nodes of the first to fourth page buffers may be electrically separated from each other. Accordingly, a capacitance value of the sensing node of the fifth page buffer may be smaller than when the sensing nodes of all page buffers are connected to each other. Accordingly, the discharge period of the fifth page buffer operation PB0[4] may be set to a relatively shorter time than the discharge period of the first page buffer operation PB0[0]. For example, a discharge period of a page buffer operation on the fifth to eighth page buffers belonging to the second group may be set to be shorter than a discharge period of a page buffer operation of the first group.

The remaining page buffer operations may also be performed by the operation sequence as illustrated in FIG. 11. For example, a sensing period may be skipped in the second to fourth page buffer operations PB0[1] to PB0[3], whereas a sensing period may be performed in the remaining sixth to eighth page buffer operations PB0[5] to PB0[7]. Also, in a sensing period of each of the sixth to eighth page buffer operations PB0[5] to PB0[7], sensing operations on sensing nodes of two page buffers may be performed together. Also, in discharge periods of the sixth to eighth page buffer operations PB0[5] to PB0[7], electrical connection between the sensing nodes of the first to fourth page buffers and the sensing nodes of the fifth to eighth page buffers may be disconnected, and thus, the discharge periods of the sixth to eighth page buffer operations PB0[5] to PB0[7] may be set to have a relatively short time.

According to the embodiment as described above, because discharge periods of four page buffer operations of the first to eighth page buffer operations may be set to have a relatively short time, the time required for the entire operation sequence related to the program/read operation of data may be further reduced. That is, as illustrated in FIG. 11, according to embodiments, the time required for a discharge period and a sensing period in the entire operation sequence may be reduced compared to an existing case.

Meanwhile, in the above-described embodiment, a case in which all sensing nodes of the first to eighth page buffers are precharged in the precharge period of the first page buffer operation PB0[0], and the sensing nodes of the fifth to eighth page buffers are precharged in the discharge period of the fifth page buffer operation PB0[4], embodiments are not necessarily limited thereto. For example, in a precharge period of each page buffer operation, only a sensing node of a corresponding page buffer may be precharged, or sensing nodes of some page buffers may be selectively precharged.

Figure 12:
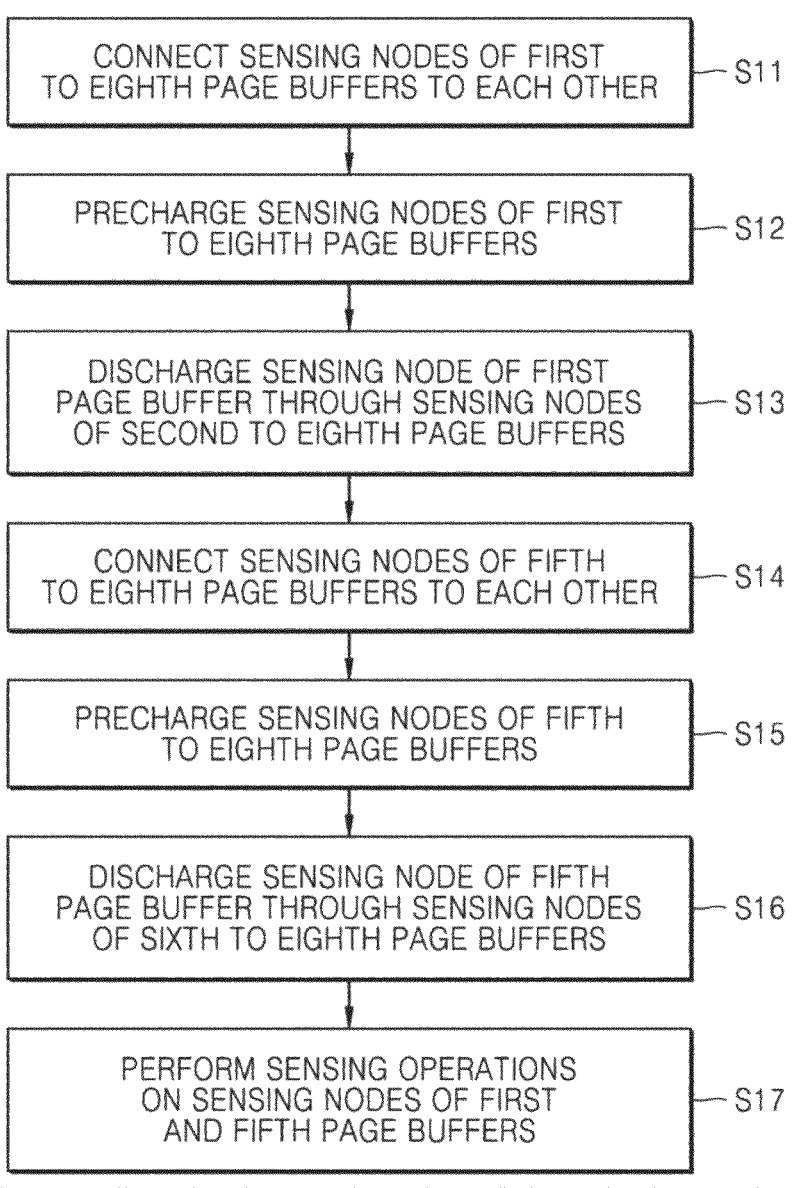

FIGS. 12 and 13 are flowcharts illustrating an operating method of a memory device according to embodiments.

Referring to FIG. 12, a page buffer circuit according to embodiments may include first to eighth page buffers as a plurality of page buffers. According to the above-described embodiments, a plurality of page buffer units and a plurality of cache units may be physically separated from each other, and the page buffer units and the cache units may be electrically connected to each other through a combined sensing node. Also, according to the above-described embodiments, a first group may include the first to fourth page buffers, a second group may include the fifth to eighth page buffers, and a page buffer operation on the page buffers of the first group may be performed differently from a page buffer operation on the page buffers of the second group.

First to eighth page buffer operations may be performed as an operation sequence for the first to eighth page buffers. In a precharge period of the first page buffer operation, sensing nodes of the first to eighth page buffers may be electrically interconnected through control of pass transistors of the first to eighth page buffers (operation S11). Also, precharge transistors may be activated to precharge the sensing nodes of the first to eighth page buffers may be precharged (operation S12). Thereafter, to discharge the sensing node of the first page buffer, a switch operation may be performed to electrically connect a cache latch of the first page buffer to the combined sensing node, and the sensing node of the first page buffer may be discharged through a path including the sensing nodes of the second to eighth page buffers (operation S13).

Thereafter, without performing a sensing operation on the sensing node of the first page buffer, a precharge period of the fifth page buffer operation may be entered. In the precharge period of the fifth page buffer operation, the sensing nodes of the fifth to eighth page buffers may be electrically connected to each other through control of the pass transistors of the first to eighth page buffers (operation S14). Also, by turning on precharge transistors of the fifth to eighth page buffers, the sensing nodes of the fifth to eighth page buffers may be precharged (operation S15). Thereafter, to discharge the sensing node of the fifth page buffer, a switch operation may be performed to electrically connect a cache latch of the fifth page buffer to the combined sensing node, and the sensing node of the fifth page buffer may be discharged through a path including the sensing nodes of the sixth to eighth page buffers (operation S16).

Thereafter, in a sensing period of the fifth page buffer operation, the sensing nodes of the first to eighth page buffers may be electrically separated from each other, and sensing operations on the sensing nodes of the first and fifth page buffers may be performed together (operation S17). For example, a switching operation for electrically connecting the sensing node of the first page buffer to a sensing latch thereof and a switching operation for electrically connecting the sensing node of the fifth page buffer to a sensing latch thereof may be performed. Although not illustrated in FIG. 12, after the fifth page buffer operation is completed, the second page buffer operation of the first group and the sixth page buffer operation of the second group may be performed according to the above-described flows, and the third and fourth page buffer operations of the first group and the seventh and eighth page buffer operations of the second group may be performed according to the above-described flows.

Meanwhile, referring to FIG. 13, page buffers included in a page buffer circuit may be classified into a plurality of groups. For example, the page buffers may be classified into first to Nth groups, and N may have a value of 3 or more. Also, in an embodiment, each of the page buffers may include one or more pass transistors that control connection between sensing nodes of the page buffers, and first to Nth pass control signals may be generated in correspondence to the first to Nth groups. Also, the page buffers of each group may commonly receive the corresponding pass control signal.

A first page buffer operation may be performed on any one page buffer of the first group, and in the first page buffer operation, a precharge period and a discharge period may be performed on the page buffer of the first group (operation S21). In this case, according to the above-described embodiments, the sensing nodes of all page buffers included in the first to Nth groups may be electrically connected to each other.

Thereafter, a second page buffer operation may be performed on any one page buffer of the second group, and in the second page buffer operation, a precharge period and a discharge period may be performed on the page buffer of the second group (operation S22). In this case, according to the above-described embodiments, the sensing nodes of the page buffers included in the second to Nth groups may be electrically connected to each other, whereas electrical connection between the sensing nodes of the page buffers included in the first group and the sensing nodes of the page buffers included in the second to Nth groups may be cut off.

The above-described page buffer operations may be performed sequentially, and in the (N−1)th page buffer operation, a precharge period and a discharge period may be performed on a page buffer of the (N−1)th group (S23). In this case, the sensing nodes of the page buffers included in the (N−1)th and Nth groups may be electrically connected to each other, whereas electrical connection between the sensing nodes of the page buffers included in the first to (N−2)th groups and the sensing nodes of the page buffers included in the (N−1)th and Nth groups may be cut off. Also, in the Nth page buffer operation, a precharge period and a discharge period may be performed on a page buffer of the Nth group (operation S24). In this case, the sensing nodes of the page buffers included in the Nth group may be electrically connected to each other, whereas electrical connection between the sensing nodes of the page buffers included in the first to (N−1)th groups and the sensing nodes of the page buffers included in the Nth group may be cut off.

After the above-described operations are performed, a sensing period of the Nth page buffer operation may be performed, and in the sensing period, electrical connection between the sensing nodes of all page buffers included in the first to Nth groups may be cut off. Also, the sensing node of any one page buffer in each of the first to Nth groups may have a voltage level according to a discharge result, and in the sensing period, sensing operations on the sensing nodes of the page buffers of each of the first to Nth groups may be performed together (operation S25).

Figure 14:
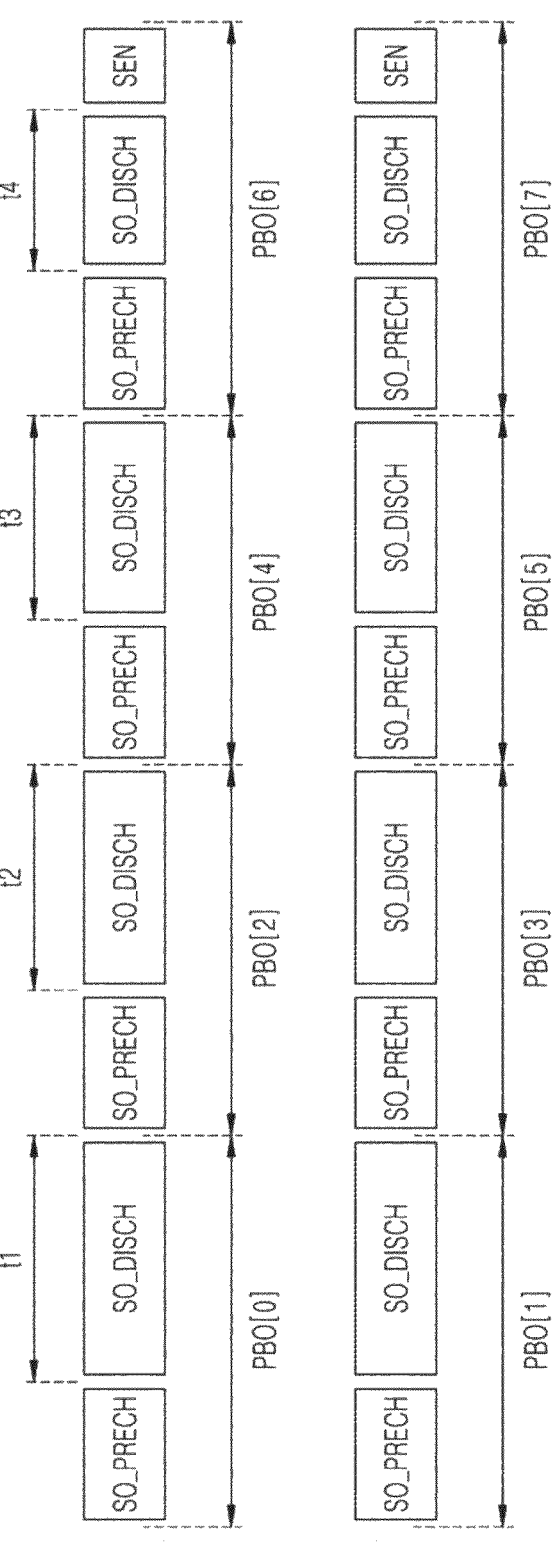
FIG. 14 is a diagram illustrating an example of an operation sequence in the embodiment described in FIG. 13.

FIG. 14 is a diagram illustrating an example of an operation sequence in the embodiment described in FIG. 13. FIG. 14 illustrates a case in which a page buffer circuit includes first to eighth page buffers, and the page buffers are classified into four groups, so that a first group includes the first and second page buffers, a second group includes the third and fourth page buffers, a third group includes the fifth and sixth page buffers, and a fourth group includes the seventh and eighth page buffers.

A precharge period and a discharge period may be performed in a first page buffer operation PB0[0] on the first page buffer of the first group, a sensing node of the first page buffer may be changed to a floating state, and thus, a voltage level changed in the discharge period may be maintained in a first sensing node. Also, in the first page buffer operation PB0[0], the discharge period may be set to a first time t1. Also, a precharge period and a discharge period may be performed in a third page buffer operation PB0[2] on the third page buffer of the second group, a sensing node of the third page buffer may be changed to a floating state, and thus, a voltage level changed in the discharge period may be maintained in a third sensing node. Also, in the third page buffer operation PB0[2], the discharge period may be set to a second time t2. Similarly, a precharge period and a discharge period may be performed in a fifth page buffer operation PB0[4] on the fifth page buffer of the third group, a sensing node of the fifth page buffer may be changed to a floating state, and thus, a voltage level changed in the discharge period may be maintained in a fifth sensing node. Also, in the fifth page buffer operation PB0[4], the discharge period may be set to a third time t3. In the above-described page buffer operations on the page buffers of the first to third groups, a sensing period may be skipped.

Thereafter, a precharge period and a discharge period may be performed in a seventh page buffer operation PB0[6] on the seventh page buffer of the fourth group, and the discharge period may be set to a fourth time t4. In this case, the largest number of sensing nodes may be electrically connected to each other in the discharge period of the first page buffer operation PB0[0], whereas the smallest number of sensing nodes may be electrically connected to each other in the discharge period of the seventh page buffer operation PB0[6]. Also, the first time t1 may have the longest value, whereas the fourth time t4 may have the shortest value. For example, the first time t1 may be longer than the second time t2, the second time t2 may be longer than the third time t3, and the third time t3 may be longer than the fourth time t4. Also, in a sensing period of the seventh page buffer operation PB0[6], sensing operations on first, third, fifth, and seventh sensing nodes may be performed together.

Thereafter, similarly to the above-described page buffer operations, second, fourth, sixth, and eighth page buffer operations PB0[1], PB0[3], PB0[5], and PB0[7] may be performed, and in a sensing period of the eighth page buffer operation PB0[7], sensing operations on second, fourth, sixth, and eighth sensing nodes may be performed together.

Figure 15:
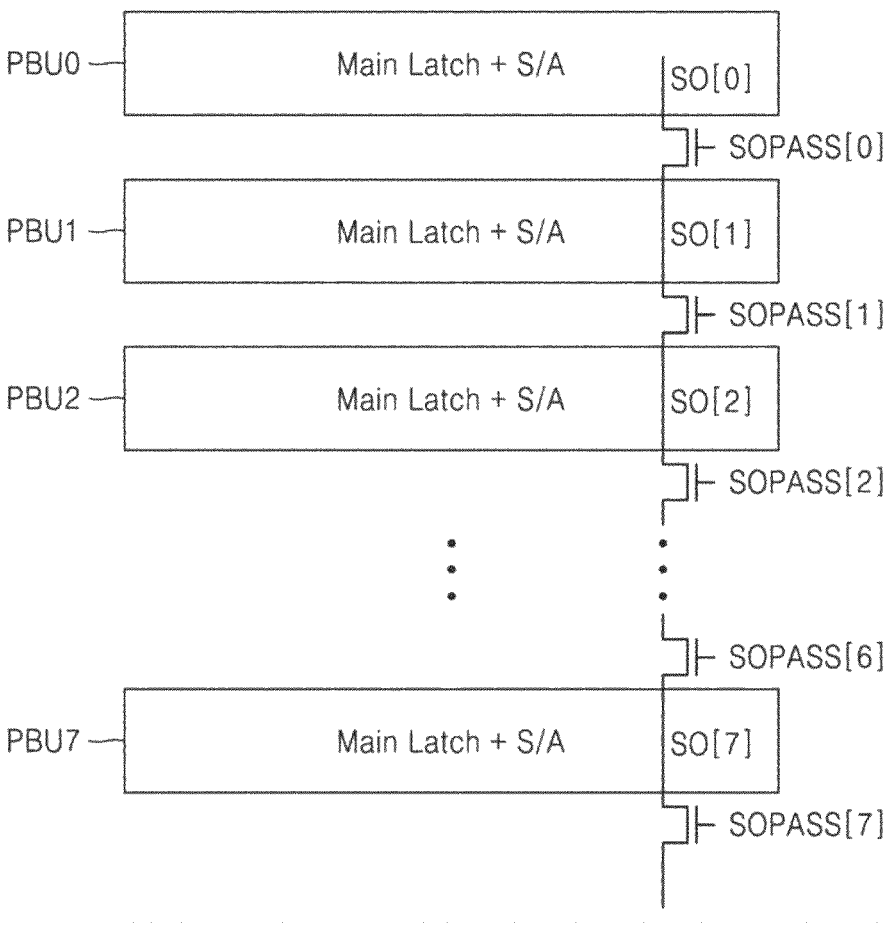
FIG. 15 is a diagram illustrating an operation example of a page buffer circuit according to other embodiments.

FIG. 15 is a diagram illustrating an operation example of a page buffer circuit according to other embodiments. FIG. 15 illustrates a case in which each of first to eighth page buffers is controlled separately, and thus, first to eighth pass control signals SOPASS[0] to SOPASS[7] are provided to a page buffer circuit. Also, although FIG. 15 illustrates only one pass transistor corresponding to each page buffer for convenience of description, a larger number of pass transistors may be arranged according to the above-described embodiments.

Each of first to eighth page buffer units PBU0 to PBU7 may include one or more main latches and a sense amplifier, and first to eighth sensing nodes SO0 to SO7 of the first to eighth page buffers may be electrically connected to each other based on the first to eighth pass control signals SOPASS[0] to SOPASS[7]. Also, although not illustrated in FIG. 15, the page buffer circuit may include a combined sensing node SOC, and the first to eighth sensing nodes SO0 to SO7 may be connected to cache units through the combined sensing node SOC.

In an embodiment, the first to eighth pass control signals SOPASS[0] to SOPASS[7] may have an enable level in a precharge period and a discharge period for the first page buffer. Also, in a precharge period and a discharge period for the second page buffer, the first pass control signal SOPASS [0] may have a disable level. Also, in a precharge period and a discharge period for the eighth page buffer, the first to seventh pass control signals SOPASS[0] to SOPASS[6] may have a disable level. Also, in a sensing period for the eighth page buffer, sensing operations on sensing nodes respectively included in the first to eighth page buffers may be performed together.

Figure 16:
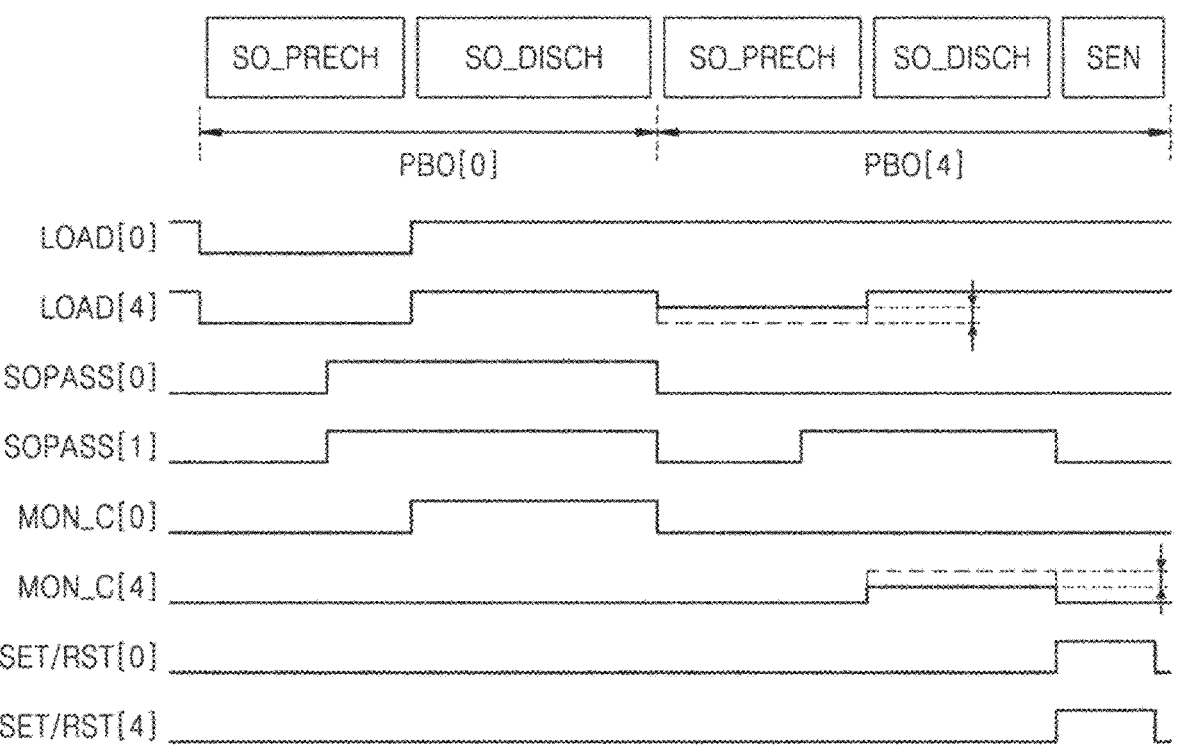
FIG. 16 is a waveform diagram illustrating examples of various control signals that may be applied to a page buffer operation, according to embodiments.

FIG. 16 is a waveform diagram illustrating examples of various control signals that may be applied to a page buffer operation, according to embodiments. Detailed descriptions of signals illustrated in FIG. 16 that overlap those of signals described in the embodiment of FIG. 10 are omitted.

Referring to FIG. 16, a precharge and a discharge period may be performed in the first page buffer operation PB0[0] on the first page buffer, whereas a precharge period, a discharge period, and a sensing period may be performed in the fifth page buffer operation PB0[4] on the fifth page buffer. Also, according to the above-described embodiments, a capacitance value of the fifth sensing node may be relatively small in the fifth page buffer operation PB0[4], and thus, the discharge period of the fifth page buffer operation PB0[4] may be set to be relatively short.

In embodiments, a precharge period and/or a discharge period may be controlled differently for each group of page buffers. For example, in the precharge period of the fifth page buffer operation PB0[4], the fifth sensing node may be precharged at a relatively low level, and by adjusting the level of the fifth load signal LOAD[4], a precharge transistor may be turned on relatively weakly, thereby adjusting the precharge level of the fifth sensing node. Alternatively, in an embodiment, the precharge level of the fifth sensing node may be adjusted by adjusting the level of a precharge voltage provided to the precharge transistor.

Alternatively, in an embodiment, the level of a cache monitoring signal may be adjusted in the discharge period of the fifth page buffer operation PB0[4]. For example, by adjusting the level of the fifth cache monitoring signal MON_C[4] in the fifth page buffer operation PB0[4], a monitor transistor may be turned on relatively weakly.

According to the above-described operation example, in a page buffer operation of a page buffer belonging to the second group, a sensing node may have a relatively small value, and in response, a discharge period may be set to be short, or the levels of various control signals used in the page buffer operation may be adjusted. For example, the power consumed in the page buffer operation may be reduced by lowering the level of a control signal or setting the turn-on degree of a transistor to be weak.

Figure 17A:
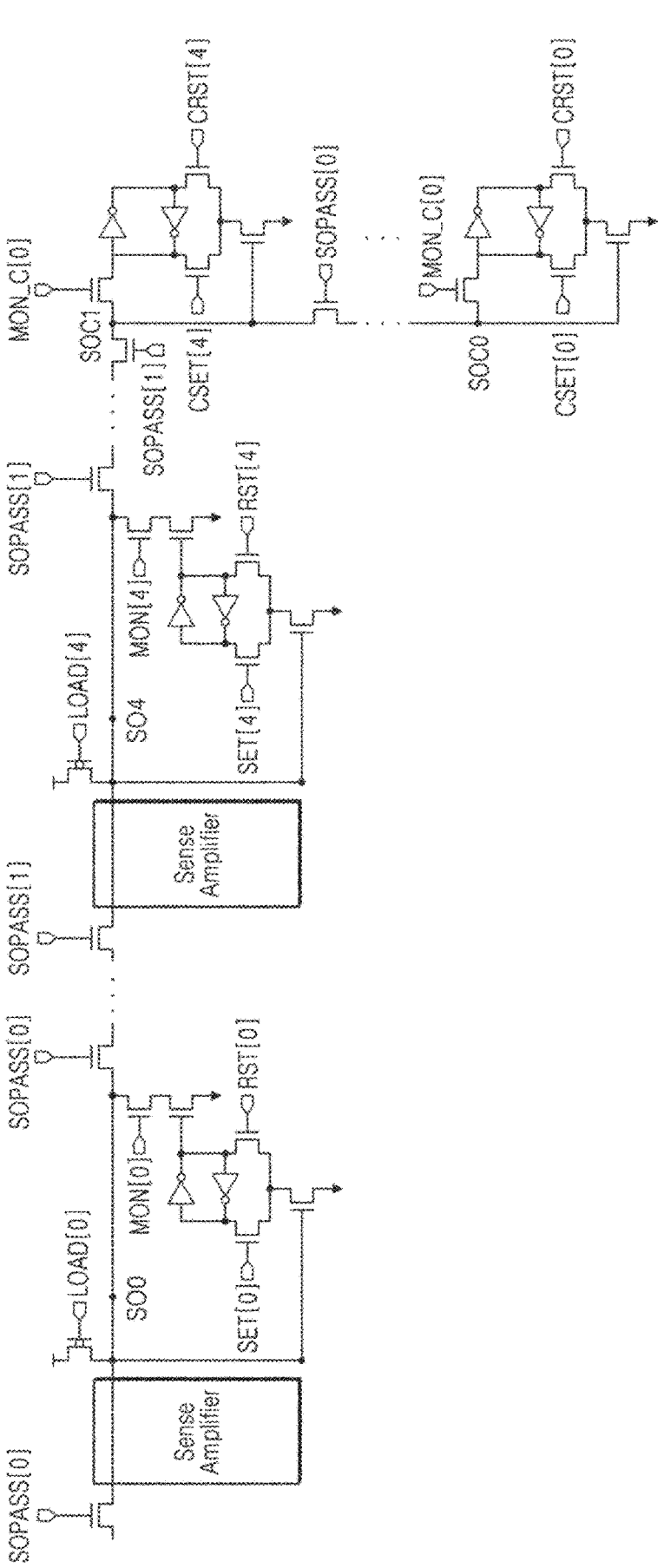
FIGS. 17A and 17B are circuit diagrams illustrating an operation example of a memory device according to other embodiments.
Figure 17B:
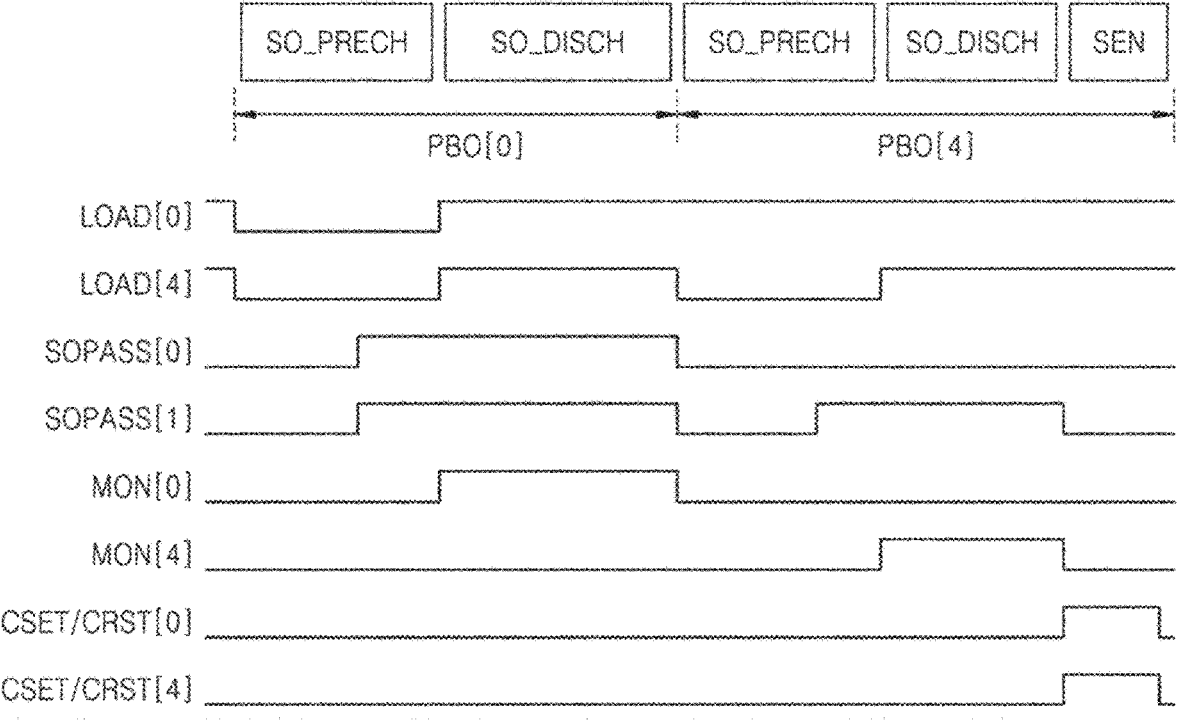

FIGS. 17A and 17B are circuit diagrams illustrating an operation example of a memory device according to other embodiments. In describing the configuration and operation example of the memory device illustrated in FIGS. 17A and 17B, detailed descriptions that overlap those provided with reference to FIG. 9 are omitted.

Referring to FIG. 17A, the first page buffer unit PBU0 of the first page buffer and the fifth page buffer unit PBU4 of the fifth page buffer may be implemented identically to the configuration illustrated in FIG. 9. Accordingly, an operation for dumping data from a cache latch to a sensing latch, as a page buffer operation according to the above-described embodiments, may be applied equally to the page buffer circuit illustrated in FIG. 17A. That is, based on control of the first and second pass control signals SOPASS[0] and SOPASS[1], sensing operations on the first sensing node SO0 and the fifth sensing node SO4 may be performed together.

Meanwhile, the skipping of a sensing period in some page buffer operations and the simultaneous sensing operations on at least two sensing nodes in some other page buffer operations, according to embodiments, may be applied equally or similarly to an operation sequence in which data is dumped from a sensing latch to a cache latch. For example, the first cache unit CU0 may be connected to a first combined sensing node SOC0 through a monitor transistor that receives the first cache monitoring signal MON_C[0] and may include a latch circuit, along with transistors that are controlled by a cache set/reset signal CSET/CRST[0]. Also, the fifth cache unit CU4 may be connected to a second combined sensing node SOC1 through a monitor transistor that receives the fifth cache monitoring signal MON_C[4] and may include a latch circuit, along with transistors that are controlled by a cache set/reset signal CSET/CRST[4].

Although not illustrated in FIG. 17A, the first to eighth cache units may also be classified into at least two groups, the first to fourth cache units may be classified into a first group, and the fifth to eighth cache units may be classified into a second group. Also, one or more cache pass transistors for controlling electrical connection between the first and second combined sensing nodes SOC0 and SOC1 may be further provided in the page buffer circuit. For example, a first cache pass transistor may be provided to control the electrical connection between the first combined sensing node SOC0 and the second combined sensing node SOC1, and the first cache pass transistor may be controlled by the first pass control signal SOPASS[0]. Also, a second cache pass transistor for controlling electrical connection between the second combined sensing node SOC1 and a page buffer unit may be provided, and the second cache pass transistor may be controlled by the second pass control signal SOPASS[1].

In the embodiment illustrated in FIG. 17A, the cache units are classified into two groups, and thus, the first and second pass control signals SOPASS[0] and SOPASS[1], along with the first and second cache pass transistors, are illustrated, but embodiments are not necessarily limited thereto. For example, even when the second cache pass transistors are removed from the page buffer circuit, a page buffer operation according to embodiments may be performed. Alternatively, based on group classification of the cache units, a larger number of cache pass transistors may be provided in the page buffer circuit. Also, in FIG. 17A, as signals for controlling electrical connection between the combined sensing nodes, the first and second pass control signals SOPASS[0] and SOPASS[1], which are the same as signals for controlling electrical connection between the sensing nodes of the page buffer units, are illustrated, but embodiments are not necessarily limited thereto. For example, control signals for controlling the electrical connection between the sensing nodes of the page buffer units and control signals for controlling the electrical connections between the combined sensing nodes of the cache units may be implemented separately.

To dump data from a sensing latch to a cache latch, first to eighth page buffer operations may be performed in correspondence to the first to eighth page buffers. In this case, the first page buffer operation for transferring data from a sensing latch of the first page buffer to a cache latch of the first cache unit CU0 may include a precharge period and a discharge period, whereas the fifth page buffer operation for transferring data from a sensing latch of the fifth page buffer to a cache latch of the fifth cache unit CU4 may include a precharge period, a discharge period, and a sensing period. Also, a voltage level of the first combined sensing node SOC0 may be discharged through the discharge periods of the first page buffer operation, a voltage level of the second combined sensing node SOC1 may be discharged through the discharge periods of the fifth page buffer operation, and in the sensing period of the fifth page buffer operation, sensing operations on the first combined sensing node SOC0 and the second combined sensing node SOC1 may be performed together, and thus, operations of storing (or dumping) data in the first cache latch and the fifth cache latch may be performed together.

An operation example of the page buffer circuit of FIG. 17A will be described with reference to the waveform diagram illustrated in FIG. 17B as follows.

In the first page buffer operation PB0[0], the first and fifth load signals LOAD[0] and LOAD[4] may be changed to an enable level, and the first and second pass control signals SOPASS[0] and SOPASS[1] may also be changed to an enable level. Accordingly, the sensing nodes of the page buffer units may be precharged, and the first and second combined sensing nodes SOC0 and SOC1, which are electrically connected to the sensing nodes of the page buffer units, may also be precharged. Although not illustrated in FIG. 17B, by controlling the precharge transistor PMa in the embodiment illustrated in FIG. 8, precharge operations may be performed on the first and second combined sensing nodes SOC0 and SOC1. Thereafter, the first monitor control signal MON[0] may be changed to an enable level in the discharge period of the first page buffer operation PB0[0], and thus, a discharge operation on the first combined sensing node SOC0 may be performed based on data stored in a first sensing latch.

Without performing a sensing period, in which data is stored in a first cache latch based on the voltage level of the first combined sensing node SOC0, in the first page buffer operation PB0[0], the fifth page buffer operation PB0[4] may be performed. In the precharge and/or discharge period of the fifth page buffer operation PB0[4], a precharge operation may be selectively performed only on the second combined sensing node SOC1, based on control of the first and second pass control signals SOPASS[0] and SOPASS[1]. Also, the fifth monitor control signal MON[4] may be changed to an enable level, and thus, a discharge operation may be performed on the second combined sensing node SOC1 based on data stored in a fifth sensing latch.

According to the above-described operation, each of the first and second combined sensing nodes SOC0 and SOC1 may maintain the voltage level according to the discharge operation, and in the sensing period of the fifth page buffer operation PB0[4], sensing operations on the first and second combined sensing nodes SOC0 and SOC1 may be performed together. For example, through control by the cache set/reset signal CSET/CRST[0], data corresponding to the voltage levels of the first and second combined sensing nodes SOC0 and SOC1 may be stored together in the first and fifth cache latches.

According to the above-described embodiments, a data transfer or dump operation between a main latch and a cache latch may be performed in various memory operations, such as program/read/erase operations, of a memory device, and the time required for an operation sequence related to the data transfer may be reduced.

Figure 18:
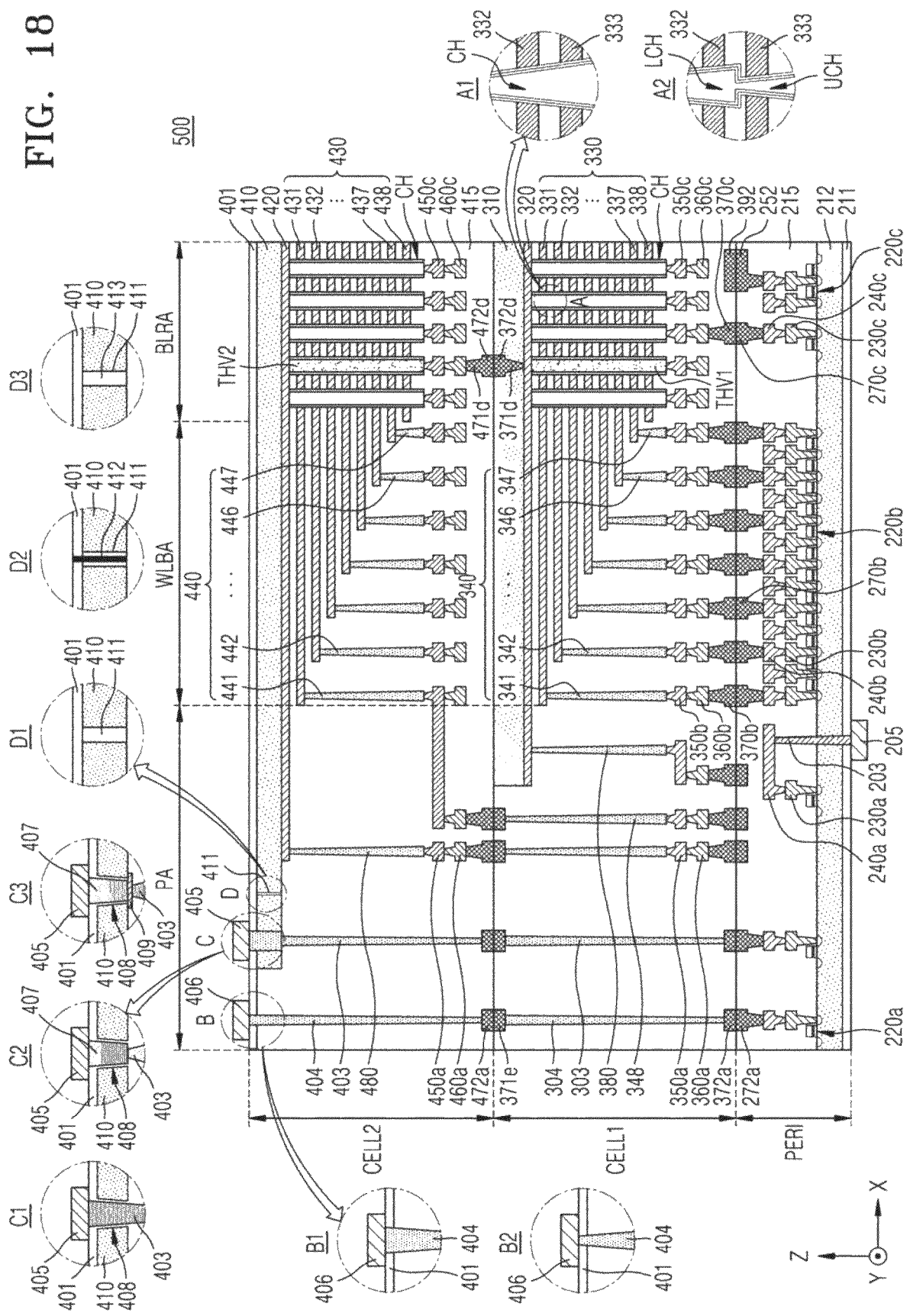
FIG. 18 is a diagram illustrating a memory device according to an embodiment.

FIG. 18 is a view illustrating a memory device 500 according to some embodiments of the inventive concepts.

Referring to FIG. 18, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 18, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 18. However, embodiments of the inventive concepts are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

The first metal lines 230a, 230b and 230c and the second metal lines 240a, 240b and 240c are illustrated and described in the present embodiments. However, embodiments of the inventive concepts are not limited thereto. In certain embodiments, at least one or more additional metal lines may further be formed on the second metal lines 240a, 240b and 240c. In this case, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel to the top surface of the second substrate 310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350c and the second metal line 360c. As a length of a channel increases, due to characteristics of manufacturing processes, it may be difficult to form a channel having a substantially uniform width. The memory device 500 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

Meanwhile, the number of the lower word lines 331 and 332 penetrated by the lower channel LCH is less than the number of the upper word lines 333 to 338 penetrated by the upper channel UCH in the region 'A2'. However, embodiments of the inventive concepts are not limited thereto. In certain embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 18, the first through-electrode THV1 may penetrate the common source line 320 and the plurality of word lines 330. In certain embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372d and a second through-metal pattern 472d. The first through-metal pattern 372d may be formed at a bottom end of the first upper chip including the first cell region CELL1, and the second through-metal pattern 472d may be formed at a top end of the second upper chip including the second cell region CELL2. The first through-electrode THV1 may be electrically connected to the first metal line 350c and the second metal line 360c. A lower via 371d may be formed between the first through-electrode THV1 and the first through-metal pattern 372d, and an upper via 471d may be formed between the second through-electrode THV2 and the second through-metal pattern 472*d*. The first through-metal pattern 372*d* and the second through-metal pattern 472*d* may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

Referring continuously to FIG. 18, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350*b* and second metal lines 360*b* may be sequentially connected onto the cell contact plugs 340 connected to the word lines 330. In the word line bonding region WLBA, the cell contact plugs 340 may be connected to the peripheral circuit region PERI through upper bonding metal patterns 370*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 370*b* of the first cell region CELL1 and the upper bonding metal patterns 270*b* of the peripheral circuit region PERI. In some embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other by the bonding method. The upper bonding metal patterns 370*b* and the upper bonding metal patterns 270*b* may be formed of aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be disposed in the external pad bonding region PA. Referring to FIG. 18, a lower insulating layer 201 may cover a bottom surface of the first substrate 210, and a first input/output pad 205 may be formed on the lower insulating layer 201. The first input/output pad 205 may be connected to at least one of a plurality of the circuit elements 220*a* disposed in the peripheral circuit region PERI through a first input/output contact plug 203 and may be separated from the first substrate 210 by the lower insulating layer 201. In addition, a side insulating layer may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220*a* disposed in the peripheral circuit region PERI through second input/output contact plugs 403 and 303, and the third input/output pad 406 may be connected to at least one of the plurality of circuit elements 220*a* disposed in the peripheral circuit region PERI through third input/output contact plugs 404 and 304.

In some embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In certain embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, embodiments of the inventive concepts are not limited thereto, and in certain embodiments, the diameter of the second input/output contact plug 403 may become progressively less toward the second input/output pad 405.

In certain embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371e or may become progressively greater toward the lower metal pattern 371e.

Meanwhile, in some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some embodiments, as illustrated in a region 'D1', the slit 411 may be formed to penetrate the third substrate 410. For example, the slit 411 may be used to prevent the third substrate 410 from being finely cracked when the opening 408 is formed. However, embodiments of the inventive concepts are not limited thereto, and in certain embodiments, the slit 411 may be formed to have a depth ranging from about 60% to about 70% of a thickness of the third substrate 410.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

Meanwhile, in certain embodiments, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

A page buffer circuit and a control circuit according to example embodiments may be disposed in the peripheral circuit area PERI of FIG. 18. According to embodiments of the present disclosure, a plurality of page buffer units may be serially connected to a combined sensing node through pass transistors without a plurality of metal patterns for connecting a plurality of page buffer units and a combined sensing node. Therefore, the plurality of metal patterns described above may not be implemented in the structural diagram shown in FIG. 18.

Figure 19:
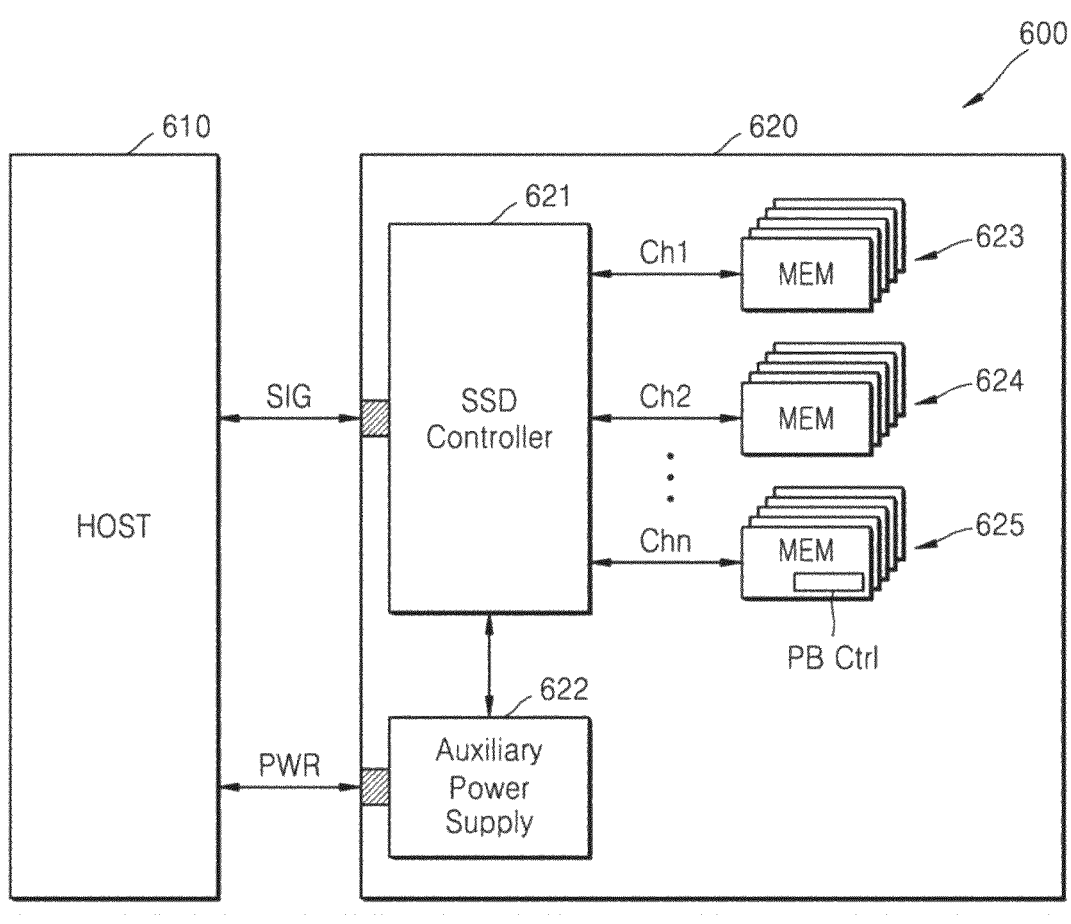
FIG. 19 is a block diagram illustrating an example in which a memory device is applied to a solid-state drive (SSD) system, according to embodiments.

FIG. 19 is a block diagram illustrating an example in which a memory device is applied to a solid-state drive (SSD) system 600, according to embodiments.

Referring to FIG. 19, the SSD system 600 may include a host 610 and an SSD 620. The SSD 620 exchange signals with the host 610 through a signal connector and receives power through a power connector. The SSD 620 may include an SSD controller 621, an auxiliary power supply 622, and memory devices 623 to 625. The memory devices 623 to 625 may be vertically stacked NAND flash memory devices. In this case, the SSD 620 may be implemented by using the embodiments described above with reference to FIGS. 1 to 18. That is, each of the memory devices 623 to 625 included in the SSD 620 may include a page buffer controller that controls page buffer operations. Also, in an embodiment, at least one memory device, along with the SSD controller 621, may constitute a memory system.

The foregoing exemplary embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A memory device comprising:
a memory cell array comprising a plurality of memory cells;
a page buffer circuit comprising first to Nth page buffers connected to the plurality of memory cells through bit lines and classified into a first group and a second group, wherein N is an integer greater than equal to 2; and
a control logic configured to control first to Nth page buffer operations on the first to Nth page buffers, in relation to a program or read operation of data, and
the control logic is further configured to:
in a page buffer operation of a page buffer belonging to the first group, perform a precharge period and a discharge period for a sensing node in the first group and omit a sensing operation; and
in a page buffer operation of a page buffer belonging to the second group, perform a precharge period and a discharge period for a sensing node in the second group and perform a sensing period for the sensing nodes belonging to the first and the second groups are sensed together.

2. The memory device of claim 1, wherein, among the first to Nth page buffers, first to Ath page buffers are classified into the first group, and (A+1)th to Nth page buffers are classified into the second group, wherein A is an integer less than N,
the control logic is further configured to control the first to Nth page buffer operations such that, in the first page buffer operation, a precharge period and a discharge period for a first sensing node of the first page buffer are performed, in the (A+1)th page buffer operation, a precharge period and a discharge period for an (A+1)th sensing node of the (A+1)th page buffer are performed,
in the first page buffer operation, a sensing operation on the first sensing node is omitted, and in a sensing period of the (A+1)th page buffer operation, sensing operations on the first and (A+1)th sensing nodes are performed together.

3. The memory device of claim 2, wherein, in a sensing period of the (A+1)th page buffer operation, data according to a voltage level of the first sensing node is stored in a sensing latch of the first page buffer, and data according to a voltage level of the (A+1)th sensing node is stored in a sensing latch of the (A+1)th page buffer.

4. The memory device of claim 1, wherein, among the first to Nth page buffers, first to Ath page buffers are classified into the first group, and (A+1)th to Nth page buffers are classified into the second group, wherein A is an integer less than N, and
wherein a discharge period of the (A+1)th page buffer operation is set to be shorter than a discharge period of the first page buffer operation.

5. The memory device of claim 1, wherein each of the first to Nth page buffers comprises a page buffer unit, a cache unit, and at least one pass transistor, the page buffer unit comprising one or more main latches, the cache unit comprising a cache latch connected to the page buffer unit through a combined sensing node, and the at least one pass transistor configured to control electrical connection with a sensing node of an adjacent page buffer,
wherein the page buffer units of the first to Nth page buffers are arranged in a first direction, and the cache units of the first to Nth page buffers are arranged in the first direction in a region separated from the page buffer units.

6. The memory device of claim 5, wherein the first group comprises first to fourth page buffers, and the second group comprises fifth to eighth page buffers,
the pass transistors of the page buffers of the first group are controlled by a first pass control signal, and the pass transistors of the page buffers of the second group are controlled by a second pass control signal,
in the precharge period and the discharge period of the first page buffer operation, the first and second pass control signals are set to an enable level to establish electrical connections between all of the sensing nodes of the first to Nth page buffers, and
in the precharge period and the discharge period of the fifth page buffer operation, the second pass control signal is selectively set to an enable level, to establish electrical connections only between the sensing nodes of the page buffers included in the second group.

7. The memory device of claim 6, wherein, in the pre-charge period and the discharge period of the fifth page buffer operation, a precharge operation and a discharge operation are selectively performed on the sensing nodes of the page buffers included in the second group.

8. The memory device of claim 6, wherein, in a sensing period of the fifth to eighth page buffer operations, the first and second pass control signals are set to a disable level to establish electrical isolation among the sensing nodes in the first to eighth page buffers.

9. The memory device of claim 6, wherein, after the fifth page buffer operation is completed, second and sixth page buffer operations on the second and sixth page buffers, third and seventh page buffer operations on the third and seventh page buffers, and fourth and eighth page buffer operations on the fourth and eighth page buffer operations are sequentially per-formed, and in the second to fourth page buffer operations, the sensing period is omitted.

10. The memory device of claim 9, wherein, in sensing periods of the sixth to eighth page buffer operations, sensing operations on a sensing node of a page buffer belonging to the first group and a sensing node of a page buffer belonging to the second group are performed together.

11. An operating method of a memory device, wherein the memory device comprises first to fourth page buffers belonging to a first group and fifth to eighth page buffers belonging to a second group, each of the first to eighth page buffers comprises a page buffer unit comprising a sensing node and a cache unit comprising a cache latch, the page buffer units of the first to eighth page buffers are arranged in a first direction, and the cache units of the first to eighth page buffers are connected to the page buffer units through a combined sensing node and are arranged in the first direction in a region separated from the page buffer units, the operating method comprising:

in a precharge period of a first page buffer operation on the first page buffer of the first group, electrically connecting the sensing nodes of the first to eighth page buffers;

in a discharge period of the first page buffer operation, discharging a first sensing node of the first page buffer according to data stored in the cache latch of the first page buffer;

omitting a sensing operation on the first sensing node, and floating the first sensing node by isolating elec-trical connections between the sensing nodes in the first to eighth page buffers;

in a precharge period of a fifth page buffer operation on the fifth page buffer of the second group, electrically connecting the sensing nodes of the fifth to eighth page buffers;

in a discharge period of the fifth page buffer operation, discharging a fifth sensing node of the fifth page buffer according to data stored in the cache latch of the fifth page buffer; and in a sensing period of the fifth page buffer operation, performing sensing operations for sensing voltage levels of the first sensing node and the fifth sensing node together.

12. The operating method of claim 11, further comprising:

sequentially performing second and sixth page buffer operations on the second and sixth page buffers;

sequentially performing third and seventh page buffer operations on the third and seventh page buffers;

sequentially performing fourth and eighth page buffer operations on the fourth and eighth page buffers;

in the second to fourth page buffer operations, omitting a sensing period; and in a sensing period of the sixth to eighth page buffer operations, performing sensing operations on sensing nodes of two page buffers together.

13. The operating method of claim 11, wherein each of the first to eighth page buffers comprises at least one pass transistor configured to control electrical connection with a sensing node of an adjacent page buffer, the pass transistors of the first to fourth page buffers are controlled by a first pass control signal, and the pass transistors of the fifth to eighth page buffers are controlled by a second pass control signal, and in the precharge period and the discharge period of the first page buffer operation, the first and second pass control signals are set to an enable level to establish electrical connections between all of the sensing nodes of the first to eighth page buffers.

14. The operating method of claim 13, wherein, in the precharge period and the discharge period of the fifth page buffer operation, the second pass control signal is selectively set to an enable level to establish electrical connections only between the sensing nodes of the fifth to eighth page buffers.

15. The operating method of claim 11, wherein the discharge period of the fifth page buffer operation is set to be shorter than the discharge period of the first page buffer operation.

16. The operating method of claim 11, wherein the cache latch of the first page buffer is connected to the page buffer units through a first combined sensing node and a second combined sensing node, and the cache latch of the fifth page buffer is connected to the page buffer units through the second combined sensing node, and the operating method further comprises: precharging the first combined sensing node while the first and second combined sensing nodes are electrically connected; and discharging the first combined sensing node according to data stored in a sensing latch of the first page buffer.

17. The operating method of claim 16, further comprising:

precharging the second combined sensing node while the first combined sensing node is electrically disconnected from the second combined sensing node;

discharging the second combined sensing node according to data stored in a sensing latch of the fifth page buffer; and storing data in the cache latches of the first and fifth page buffers by performing sensing operations on the first and second combined sensing nodes together.

18. A memory device comprising:

a memory cell array comprising a plurality of memory cells;

a page buffer circuit comprising first to Nth page buffers connected to the plurality of memory cells through bit lines; and a control logic configured to control first to Nth page buffer operations on the first to Nth page buffers, in relation to a program or read operation of data, wherein the first to Nth page buffers are classified into first to Kth groups, and K is an integer less than N, and the control logic is further configured to:

in a page buffer operation of a page buffer belonging to the first to (K−1)th groups, perform a precharge period and a discharge period for a sensing node and omit a sensing operation; and in a page buffer operation of a page buffer belonging to the Kth group, perform a precharge period and a discharge period for a sensing node and perform a sensing period such that the sensing nodes of the page buffers belonging to the first to Kth groups are sensed together.

19. The memory device of claim 18, wherein the first to Nth page buffers are classified into first to fourth groups, in a page buffer operation of a page buffer belonging to the first to third groups, a sensing operation is omitted, and in a sensing operation of a page buffer operation of a page buffer belonging to the fourth group, the sensing nodes of the first to fourth groups are sensed together.

20. The memory device of claim 18, wherein, in a precharge period of the first to (K−1)th groups, sensing nodes of page buffers belonging to a group in which precharge is performed are electrically connected to sensing nodes of page buffers belonging to the Kth group, and in a precharge period of the Kth group, electrical connection between the sensing nodes of the page buffers belonging to the Kth group and sensing nodes of page buffers belonging to the first to (K−1)th groups is cut off.

\* \* \* \* \*